United States Patent
Watanabe et al.

(10) Patent No.: US 12,004,285 B2
(45) Date of Patent: Jun. 4, 2024

(54) ACTIVATED GAS GENERATION APPARATUS

(71) Applicant: Toshiba Mitsubishi-Electric Industrial Systems Corporation, Tokyo (JP)

(72) Inventors: Kensuke Watanabe, Tokyo (JP); Ren Arita, Tokyo (JP)

(73) Assignee: TOSHIBA MITSUBISHI—ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 416 days.

(21) Appl. No.: 17/281,263

(22) PCT Filed: Aug. 22, 2019

(86) PCT No.: PCT/JP2019/032889
§ 371 (c)(1),
(2) Date: Mar. 30, 2021

(87) PCT Pub. No.: WO2021/033320
PCT Pub. Date: Feb. 25, 2021

(65) Prior Publication Data
US 2022/0007487 A1 Jan. 6, 2022

(51) Int. Cl.
*H05H 1/24* (2006.01)
*C23C 16/452* (2006.01)
*C23C 16/46* (2006.01)

(52) U.S. Cl.
CPC ......... *H05H 1/2418* (2021.05); *C23C 16/452* (2013.01)

(58) Field of Classification Search
CPC ...... H05H 1/24; H05H 1/2418; H05H 1/2406; H05H 1/30; C23C 16/452; H01J 37/02; H01J 37/32449; H01J 37/32036; H01J 37/32568; H01J 37/32715
See application file for complete search history.

(56) References Cited

U.S. PATENT DOCUMENTS

| | | | | |
|---|---|---|---|---|
| 2015/0137677 A1* | 5/2015 | Sohn | ...................... | H01T 19/04 313/268 |
| 2019/0157046 A1* | 5/2019 | Watanabe | ............ | H05H 1/2406 |
| 2021/0057192 A1* | 2/2021 | Arita | ................ | H01J 37/32357 |

FOREIGN PATENT DOCUMENTS

| | | |
|---|---|---|
| CN | 109196959 A | 1/2019 |
| JP | 8-81205 A | 3/1996 |
| JP | H0881205 A * | 3/1996 |

(Continued)

OTHER PUBLICATIONS

Office Action dated Apr. 6, 2023, in corresponding Korean patent Application No. 10-2021-7006282, 8 pages.

(Continued)

*Primary Examiner* — Thai Pham
(74) *Attorney, Agent, or Firm* — XSENSUS LLP

(57) ABSTRACT

In the present invention, a high-voltage side electrode constituent part includes a dielectric electrode and metal electrodes formed on the upper surface of the dielectric electrode. The dielectric electrode has a structure in which a film thickness is continuously changed along an X direction. That is, the film thickness of the right end of the dielectric electrode is set to a thickness dA1; and the film thickness of the left end is set to a thickness dB1 (>dA1), and is continuously increased from the right end to the left end along the X direction.

11 Claims, 16 Drawing Sheets

(56) References Cited

FOREIGN PATENT DOCUMENTS

| | | |
|---|---|---|
| JP | 2004-253275 A | 9/2004 |
| JP | 2010-272355 A | 12/2010 |
| JP | 2011-41889 A | 3/2011 |
| WO | 2016/067380 A1 | 5/2016 |
| WO | 2017/126007 A1 | 7/2017 |
| WO | 2017/203674 A1 | 11/2017 |
| WO | 2018/104988 A1 | 6/2018 |

OTHER PUBLICATIONS

Extended European Search Report dated May 11, 2022, in corresponding European Patent Application 19942568.7.
Office Action dated Nov. 13, 2022, in corresponding Korean patent Application No. 10-2021-7006282, 11 pages.
International Search Report and Written Opinion dated Nov. 19, 2019, received for PCT Application PCT/JP2019/032889, Filed on Aug. 22, 2019, 9 pages including English Translation.
Notice of Reasons for Refusal dated Dec. 1, 2020, received for Japanese Application No. 2020-509125, 7 pages including English Translation.
Office Action mailed Sep. 19, 2023, in Chinese Application No. 201980058546.3, 17 pages.

* cited by examiner

F I G. 1
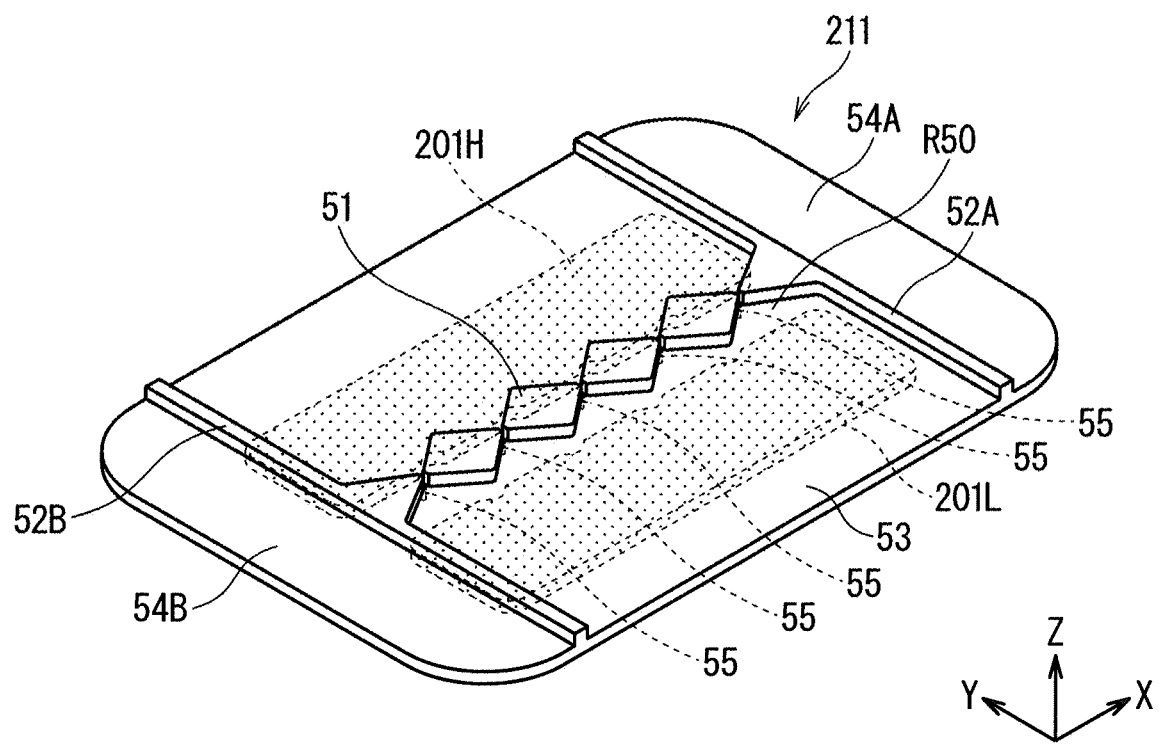

FIG. 9

| | GAP LENGTH | FILM THICKNESS OF DIELECTRIC ELECTRODE 111 | GAP PRESSURE | ENTIRE APPLIED VOLTAGE | PARTIAL DISCHARGE VOLTAGE | GENERATED N CONCENTRATION |
|---|---|---|---|---|---|---|
| | mm | mm | kPa | V | V | ppm |
| PD1 | 1 | 1 | 30 | 5000 | 4200 | 110 |
| PD2 | 1 | 3 | 30 | 5000 | 3100 | 80 |
| PD3 | 1 | 6 | 30 | 5000 | 2300 | 50 |

FIG. 14

| | GAP LENGTH | DISCHARGE AREA | FILM THICKNESS OF PARTIAL DIELECTRIC ELECTRODE 114A | RELATIVE DIELECTRIC CONSTANT OF PARTIAL DIELECTRIC ELECTRODE 114A | DIELECTRIC TYPES | FILM THICKNESS OF PARTIAL DIELECTRIC ELECTRODE 114B | RELATIVE DIELECTRIC CONSTANT OF DIELECTRIC | COMBINED DIELECTRIC CAPACITANCE | ENTIRE APPLIED VOLTAGE | PARTIAL DISCHARGE VOLTAGE |
|---|---|---|---|---|---|---|---|---|---|---|
| | mm | mm² | mm | - | - | mm | - | F | V | V |
| 14a | 1 | 3300 | 1 | 10 | DIELECTRIC a | 1 | 10 | 7.34E-11 | 5000 | 3550 |
| 14b | 1 | 3300 | 1 | 10 | DIELECTRIC b | 1 | 20 | 9.79E-11 | 5000 | 3850 |
| 14c | 1 | 3300 | 1 | 10 | DIELECTRIC c | 1 | 30 | 1.10E-10 | 5000 | 3950 |
| 14d | 1 | 3300 | 1 | 10 | DIELECTRIC d | 1 | 40 | 1.17E-10 | 5000 | 4000 |
| 14e | 1 | 3300 | 1 | 10 | DIELECTRIC e | 1 | 50 | 1.22E-10 | 5000 | 4050 |

F I G. 15

| GAP LENGTH | DISCHARGE AREA | FILM THICKNESS OF PARTIAL DIELECTRIC ELECTRODE 114A | RELATIVE DIELECTRIC CONSTANT OF PARTIAL DIELECTRIC ELECTRODE 114A | DIELECTRIC TYPES | FILM THICKNESS OF PARTIAL DIELECTRIC ELECTRODE 114B | RELATIVE DIELECTRIC CONSTANT OF DIELECTRIC | COMBINED DIELECTRIC CAPACITANCE | ENTIRE APPLIED VOLTAGE | PARTIAL DISCHARGE VOLTAGE |
|---|---|---|---|---|---|---|---|---|---|
| mm | mm² | mm | - | - | mm | - | F | V | V |
| 14a | 1 | 3300 | 1 | 9.9 | QUARTZ | 1 | 3.8 | 4E-11 | 5000 | 2900 |
| 14b | 1 | 3300 | 1 | 9.9 | ALUMINA | 1 | 9.9 | 7E-11 | 5000 | 3550 |
| 14c | 1 | 3300 | 1 | 9.9 | HfO₂ | 1 | 15 | 9E-11 | 5000 | 3750 |

ACTIVATED GAS GENERATION APPARATUS

CROSS-REFERENCE TO RELATED APPLICATION

The present application is based on PCT filing PCT/JP2019/032889, filed Aug. 22, 2019, the entire contents of which are incorporated herein by reference.

TECHNICAL FIELD

The present invention relates to an activated gas generation apparatus in which a high voltage dielectric electrode and a ground dielectric electrode are set in parallel to apply a high voltage between both the electrodes, and an activated gas is obtained with energy generated by discharge.

BACKGROUND ART

In a conventional activated gas generation apparatus, a metal electrode such as an Au film may be formed on a dielectric electrode made of ceramics or the like to form an electrode constituent part. In such an apparatus, the dielectric electrode in the electrode constituent part is a main component, and the metal electrode formed thereon is dependent.

The above-described activated gas generation apparatus generates an activated gas necessary for semiconductor production under a pressure atmosphere lower than the atmospheric pressure by a parallel plate type dielectric barrier discharge, and supplies the generated activated gas to the subsequent apparatus under a lower pressure than that of the apparatus. For example, a film formation treatment chamber can be considered as the subsequent apparatus.

In the film formation treatment chamber, in order to enable the film formation treatment of a large substrate, an activated gas generation apparatus is required, which includes a dielectric electrode having a large rectangular shape and having a plurality of gas spray holes to generate an activated gas from the plurality of gas spray holes. Such an activated gas generation apparatus is disclosed in Patent Document 1 or Patent Document 2, for example.

As an activated gas generation apparatus adopting a method for changing the concentration of an activated gas from each of a plurality of gas spray holes, a discharge generator is disclosed in Patent Document 3. In the discharge generator, n small discharge cells are individually subjected to discharge control by an n-phase inverter power supply device. The discharge generator has one power supply device itself, but it is characterized in that a discharge state is changed for each of the n small discharge cells by changing the phase of an AC high voltage. The discharge generator is characterized in that the concentration of the activated gas can be varied for each gas spray hole, while only one power supply device is required.

PRIOR ART DOCUMENTS

Patent Documents

Patent Document 1: PCT International Publication No. 2018/104988
Patent Document 2: PCT International Publication No. 2017/126007
Patent Document 3: PCT International Publication No. 2016/067380

SUMMARY

Problem to be Solved by the Invention

There is considered a case in which a conventional activated gas generation apparatus which generates an activated gas from a plurality of gas spray holes is used. In this case, the activated gas contains a plurality of partial activated gases sprayed from the plurality of gas spray holes.

In this case, depending on the structure of the film formation treatment chamber attached downstream of the activated gas generation apparatus, it is necessary to vary the concentration of the activated gas among the plurality of partial activated gases.

The simplest method for varying the concentration of the activated gas among the plurality of partial activated gases is a first activated gas generation method to be described below.

The first activated gas generation method is a method in which a plurality of activated gas generators having at least one spray hole are prepared; a plurality of activated gas generators are attached upstream of a film formation treatment chamber; and the plurality of activated gas generators are independently subjected to discharge control.

When the first activated gas generation method is adopted, it is necessary to prepare a plurality of activated gas generators and further prepare a plurality of gas supply mechanisms/power supply mechanisms and the like corresponding to the plurality of activated gas generators. This causes problems that the maximization of the installation area of the apparatus and the increase in the cost of the apparatus are unavoidable.

As a second activated gas generation method for changing the concentration of an activated gas among a plurality of partial activated gases, a method for adopting a discharge generator disclosed in Patent Document 3 is considered.

However, the second activated gas generation method does not eliminate a problem that an inverter element and the like for changing the phase is separately required.

In addition, in the second activated gas generation method, the plurality of small discharge cells need to be separated by an insulating distance. The entire discharge space is divided into a plurality of partial discharge spaces (in the plurality of small discharge cells), which causes a problem that the concentration of the activated gas is reduced as a whole.

The present invention solves the problems, and it is an object of the present invention to provide an activated gas generation apparatus which can spray an activated gas containing a plurality of types of partial activated gases having activated gas concentrations different from each other to an outside by applying one AC voltage without dividing a discharge space into a plurality of parts.

Means to Solve the Problem

An activated gas generation apparatus according to the present invention includes: a first electrode constituent part; a second electrode constituent part provided below the first electrode constituent part; and an AC power supply part applying an AC voltage to the first and second electrode constituent parts, the AC power supply part applying the AC voltage to form a discharge space between the first and second electrode constituent parts, and to generate an activated gas obtained by activating a source gas supplied to the discharge space, wherein: the first electrode constituent part includes a first dielectric electrode and a first metal electrode selectively formed on an upper surface of the first dielectric electrode; the second electrode constituent part includes a second dielectric electrode and a second metal electrode selectively formed on a bottom surface of the second dielectric electrode; in a dielectric space where the first and second dielectric electrodes face each other, a region where the first and second metal electrodes overlap each other in plan view is defined as the discharge space; the first and second metal electrodes are formed so as to extend in an electrode formation direction; the second dielectric electrode includes a plurality of gas spray holes for spraying the activated gas to an outside; the activated gas contains a plurality of partial activated gases sprayed from the plurality of gas spray holes; the plurality of gas spray holes are formed along the electrode formation direction; the discharge space is classified into a plurality of partial discharge spaces corresponding to positions of the plurality of gas spray holes in the electrode formation direction; and one dielectric electrode being one of the first and second dielectric electrodes has a parameter changing structure in which a discharge voltage contribution parameter is changed along the electrode formation direction so that a plurality of partial discharge voltages generated in the plurality of partial discharge spaces have values different from each other when the AC voltage is applied.

Effects of the Invention

The activated gas generation apparatus of the present invention according to claim 1 is characterized by having the parameter changing structure in which the discharge voltage contribution parameter is changed along the electrode formation direction so that the plurality of partial discharge voltages generated in the plurality of partial discharge spaces have values different from each other when the AC voltage is applied.

The present invention according to claim 1 has the characteristics, and thus can exhibit an effect of spraying the activated gas containing a plurality of partial activated gases having activated gas concentrations different from each other to the outside by applying one AC voltage supplied from the AC power supply part without dividing the discharge space into a plurality of parts.

The objects, features, aspects, and advantages of the present invention will become more apparent from the following detailed description and the accompanying drawings.

BRIEF DESCRIPTION OF DRAWINGS

FIG. 1 is a perspective view showing an entire structure of a dielectric electrode of a ground side electrode constituent part in an activated gas generation apparatus of a first embodiment.

FIG. 9 is an illustration diagram showing, in a table form, changes in a partial discharge voltage and a generated N concentration with a change in the film thickness of a dielectric electrode of the first embodiment.

FIG. 14 is an illustration diagram showing, in a table form, a change in a partial discharge voltage due to a laminated structure of partial dielectric electrodes of the fourth embodiment.

FIG. 15 is a graph showing, in a table form, changes in partial discharge voltages according to specific examples of dielectric types.

DESCRIPTION OF EMBODIMENTS

<Prerequisite Technique>

Figure 16:
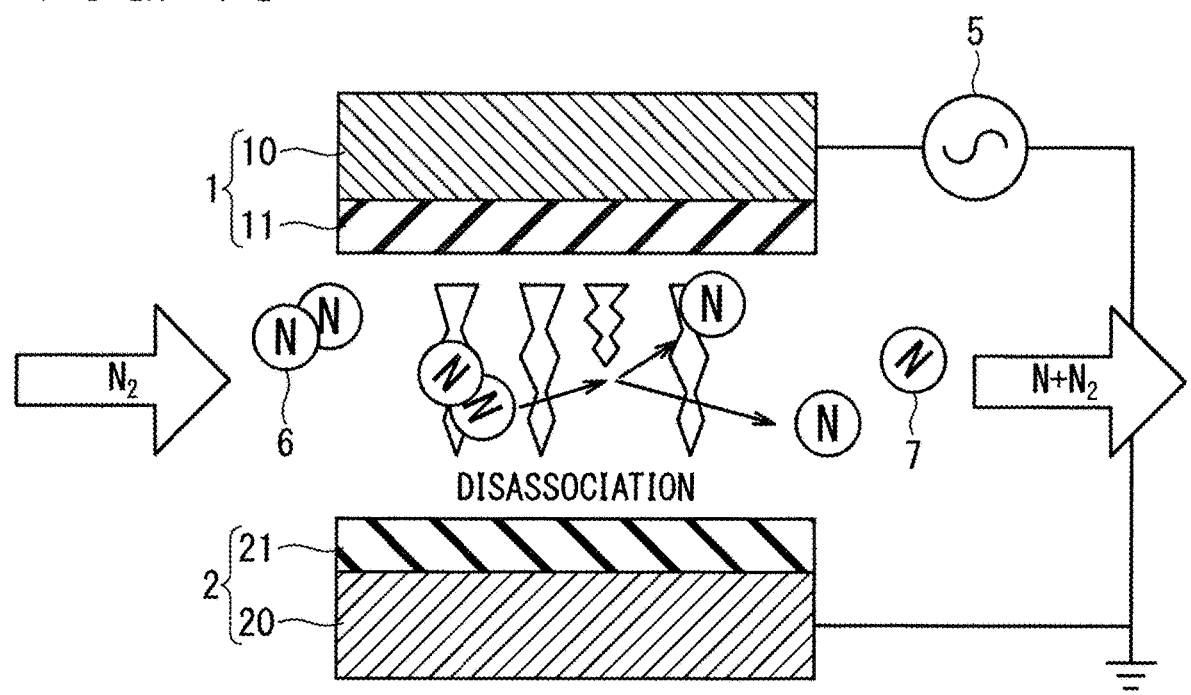
FIG. 16 is an illustration diagram schematically showing a basic configuration of an activated gas generation apparatus of the present invention.

FIG. 16 is an illustration diagram schematically showing a basic configuration of an activated gas generation apparatus of the present invention. As shown in FIG. 16, the activated gas generation apparatus includes, as the basic configuration, a high-voltage side electrode constituent part 1 (first electrode constituent part), a ground side electrode constituent part 2 (second electrode constituent part) provided below the high-voltage side electrode constituent part 1, and a high frequency power supply 5 (AC power supply part) for applying an AC voltage to the high-voltage side electrode constituent part 1 and the ground side electrode constituent part 2.

The high-voltage side electrode constituent part 1 includes a dielectric electrode 11 (first dielectric electrode) and a metal electrode 10 (first metal electrode) selectively formed on the upper surface of the dielectric electrode 11. The ground side electrode constituent part 2 includes a dielectric electrode 21 (second dielectric electrode) and a metal electrode 20 (second metal electrode) selectively formed on the bottom surface of the dielectric electrode 21. The metal electrode 20 of the ground side electrode constituent part 2 is connected to the ground level, and the AC voltage is applied from the high frequency power supply 5 to the metal electrode 10 of the high-voltage side electrode constituent part 1.

By the application of the AC voltage of the high frequency power supply 5, a region where the metal electrodes 10 and 20 overlap with each other in plan view is defined as a discharge space in a dielectric space where the dielectric electrodes 11 and 21 face each other. An activated gas generating electrode group is constituted by the above-described high-voltage side electrode constituent part 1, ground side electrode constituent part 2, and high frequency power supply 5.

In such a configuration, the discharge space is formed between the high-voltage side electrode constituent part 1 and the ground side electrode constituent part 2 by the application of the AC voltage by the high frequency power supply 5 as the AC power supply part, and a source gas 6 such as nitrogen molecules is supplied into the discharge space, to allow an activated gas 7 such as radicalized nitrogen atoms or the like to be obtained.

Activated gas generation apparatuses of first to fourth embodiments to be described below are apparatuses obtained by further developing the activated gas generation apparatus shown in FIG. 16 as a basic configuration.

First Embodiment

Figure 2A:
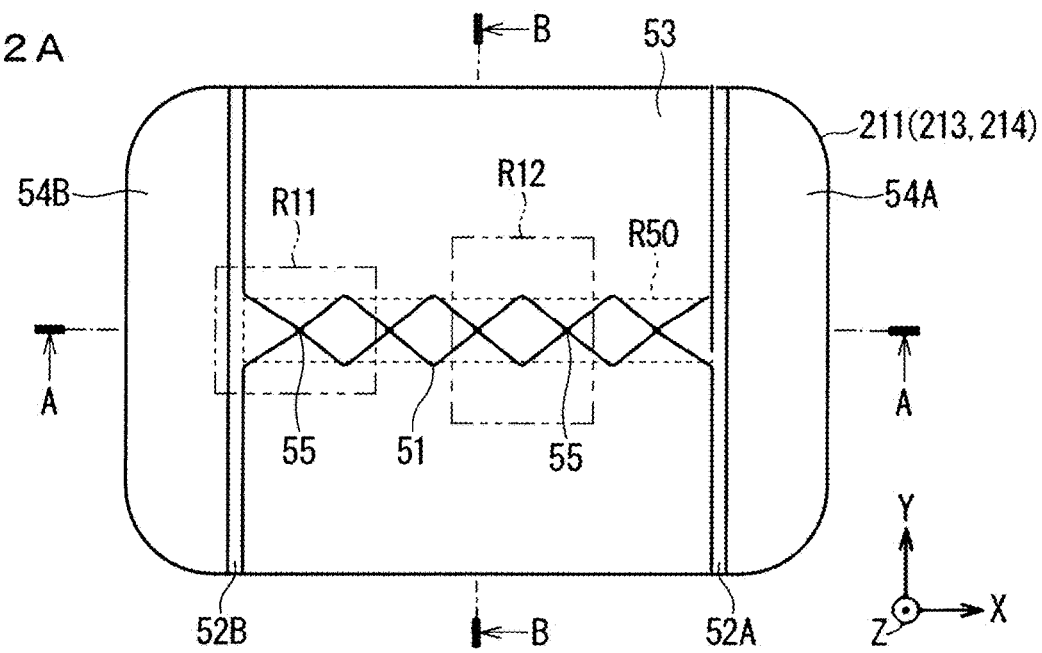
FIGS. 2A to 2D are illustration diagrams showing upper and bottom surface structures or the like of the ground side electrode constituent part of the first embodiment.
Figure 2B:
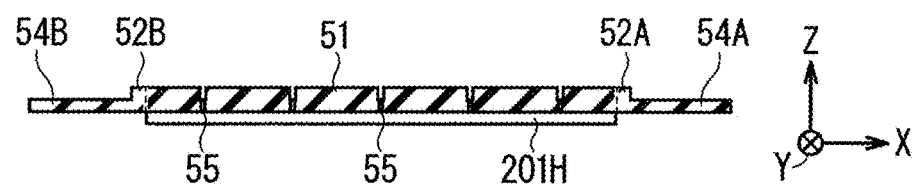
Figure 2C:
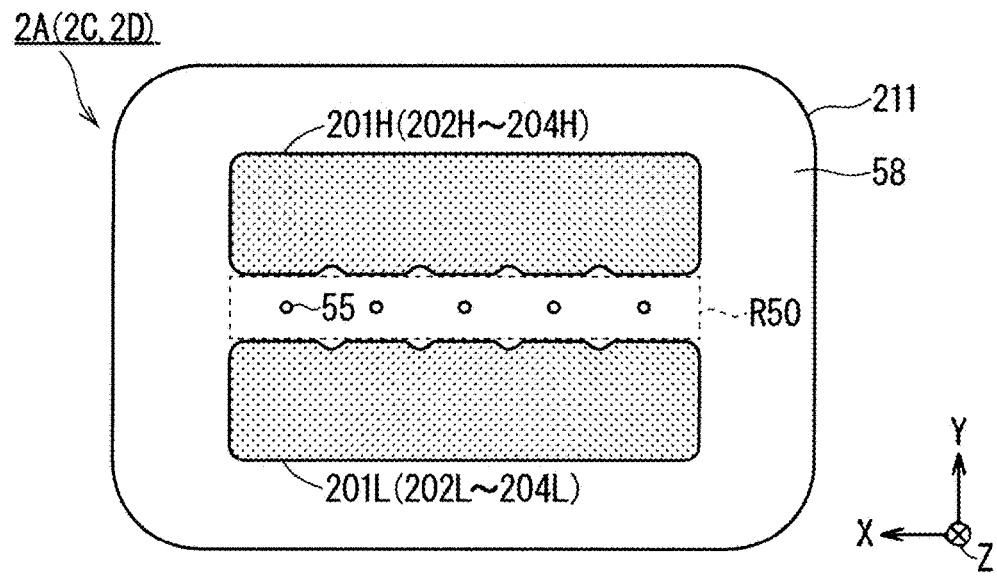
Figure 2D:
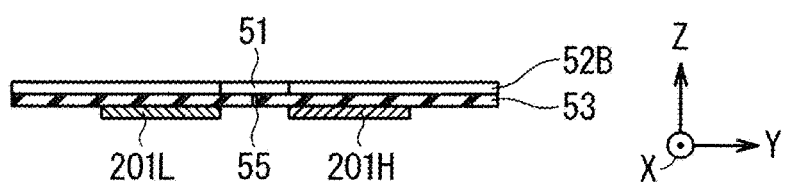
Figure 3A:
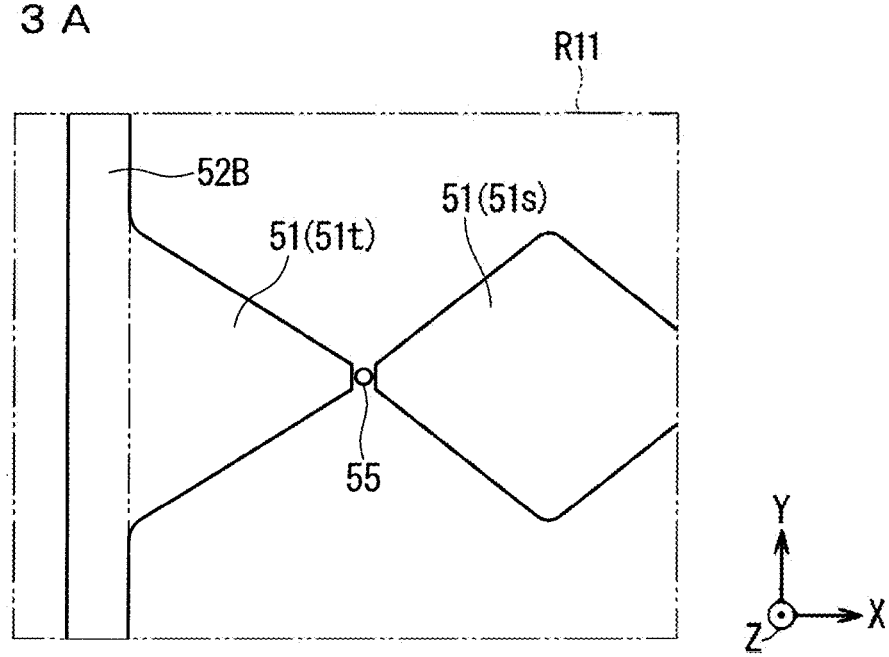
FIGS. 3A and 3B are enlarged illustration diagrams showing a focused region of FIG. 2 FIGS. 2A to 2D.
Figure 3B:
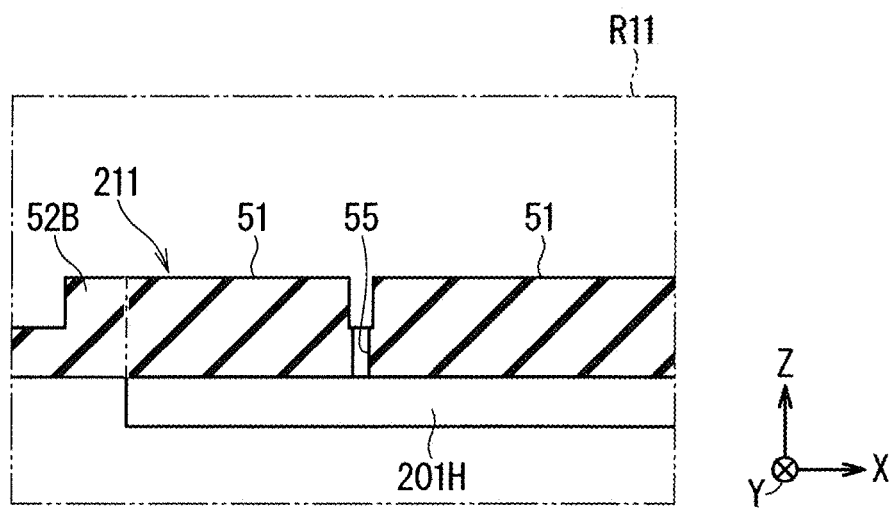

FIG. 1 is a perspective view showing an entire structure of a dielectric electrode 211 of a ground side electrode constituent part 2A in an activated gas generation apparatus of a first embodiment. FIGS. 2A to 2D are illustration diagrams showing upper and bottom surface structures or the like of the ground side electrode constituent part 2A. FIG. 2A is a top view; FIG. 2B is a cross-sectional view taken along line A-A in FIG. 2A; FIG. 2C is a bottom view, and FIG. 2D is a cross-sectional view taken along line B-B in FIG. 2A. FIGS. 3A and 3B are enlarged illustration diagrams showing a focused region R11 of FIG. 2A. FIG. 3A is a top view; and FIG. 3B is a cross-sectional view taken along line A-A in the focused region R11. An XYZ coordinate system is appropriately shown in each of FIGS. 1 to 3B.

As shown in FIGS. 1 to 3B, the ground side electrode constituent part 2A (second electrode constituent part) of the first embodiment includes the dielectric electrode 211 and metal electrodes 201H, 201L (a pair of second partial metal electrodes; second metal electrode).

The dielectric electrode 211 has a rectangular flat plate structure with an X direction as a longitudinal direction and a Y direction as a short direction in plan view. Hereinafter, in the dielectric electrode 211, with linear stepped parts 52A, 52B described below as boundaries, a central part may be referred to as a main region 53, and both end parts may be referred to as end regions 54A, 54B.

With respect to the dielectric electrode 211 (second dielectric electrode), a plurality of gas spray holes 55 (five gas spray holes 55) are provided along the X direction (first direction; electrode formation direction) in a central region R50 in the main region 53. The plurality of gas spray holes 55 are provided so as to pass through the dielectric electrode 211 from the upper surface to the bottom surface.

As shown in FIGS. 2B and 2C, the metal electrodes 201H, 201L (a pair of second partial metal electrodes) are formed on the bottom surface of the dielectric electrode 211, and disposed so as to face each other with the central region R50 of the dielectric electrode 211 sandwiched therebetween in plan view. The metal electrodes 201H, 201L have a substantially rectangular shape in plan view, and have the X direction (first direction) as the longitudinal direction (electrode formation direction), and the Y direction (second direction) crossing at a right angle to the X direction as an electrode facing direction. The metal electrodes 201H, 201L face each other along the Y direction. The metal electrodes 201H, 201L are equal to each other in size in plan view, and are symmetrically disposed with the central region R50 as the center.

The metal electrodes 201H, 201L are formed by a metalization treatment on the bottom surface of the dielectric electrode 211. As a result, the dielectric electrode 211 and the metal electrodes 201H, 201L are integrally formed to constitute the ground side electrode constituent part 2A (second electrode constituent part). Examples of the metalization treatment include treatments using a printing firing method, a sputtering treatment, and a vapor deposition treatment or the like.

Figure 5A:
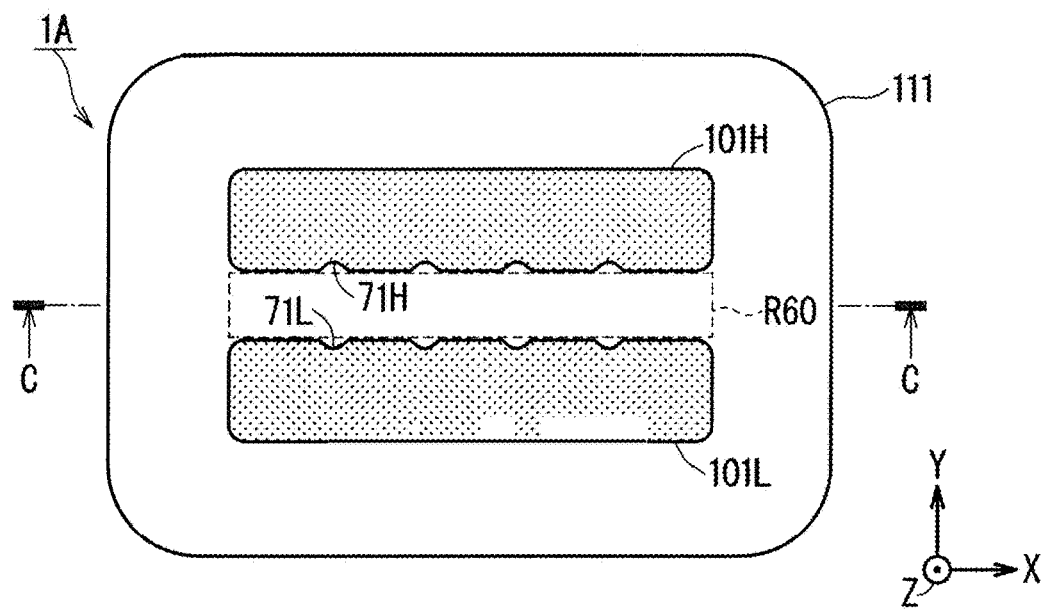
FIGS. 5A to 5C are illustration diagrams showing upper and bottom surface structures or the like of a high-voltage side electrode constituent part.
Figure 5B:
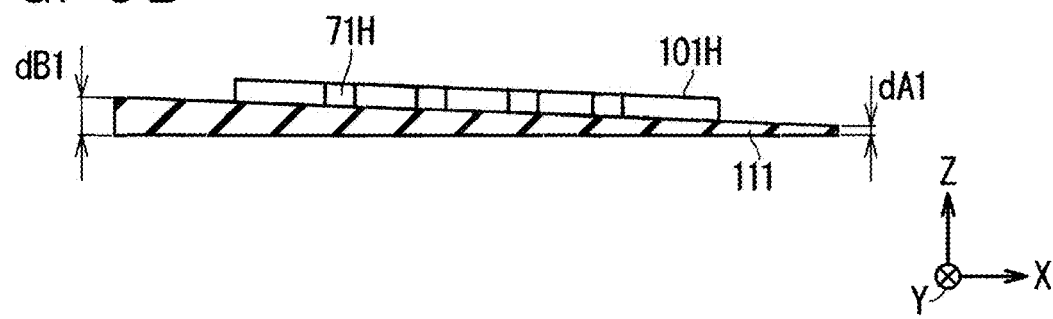
Figure 5C:
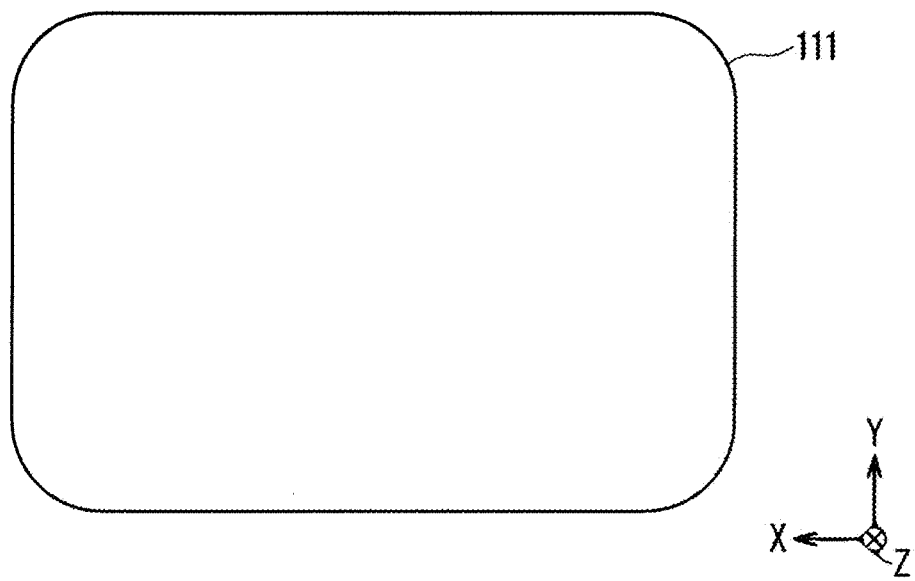

FIGS. 5A to 5C are illustration diagrams showing upper and bottom surface structures or the like of a high-voltage side electrode constituent part 1A (first electrode constituent part). FIG. 5A is a top view; FIG. 5B is a cross-sectional view taken along line C-C of FIG. 5A; and FIG. 5C is a bottom view. In FIGS. 5A to 5C, an XYZ coordinate system is appropriately shown.

As shown ink FIGS. 5A to 5C, the high-voltage side electrode constituent part 1A includes a dielectric electrode 111, and metal electrodes 101H and 101L formed on the upper surface of the dielectric electrode 111. The dielectric electrode 111 has a rectangular flat plate structure in plan view with an X direction as a longitudinal direction and a Y direction as a short direction as with the dielectric electrode 211.

As shown in FIG. 5B, the dielectric electrode 111 has a structure in which the film thickness (thickness) is continuously changed along the X direction. The film thickness of the dielectric electrode 111 is uniform along the Y direction.

Specifically, as shown in FIG. 5B, the film thickness of the right end (the end in the +X direction) of the dielectric electrode 111 is set to a thickness dA1, and the film thickness of the left end (the end in the −X direction) is set to a thickness dB1 (>dA1).

The film thickness of the dielectric electrode 111 is continuously increased from the right end (thickness dA1) to the left end (thickness dB1) along the X direction. Therefore, the upper surface of the dielectric electrode 111 has a constant inclination with respect to the horizontal direction (X direction). It is assumed that the height difference between the thickness dA1 and the thickness dB1 is, for example, about 80% of the thickness dB1.

Metal electrodes 101H, 101L (a pair of first partial metal electrodes; first metal electrode) are formed on the upper surface of the dielectric electrode 111, and are disposed so as to face each other with a central region R60 sandwiched therebetween. The central region R60 has a shape equal to that of the central region R50 of the dielectric electrode 211 in plan view. The film thickness of the metal electrodes 101H and 101L are uniform.

In this case, as with the metal electrodes 201H, 201L, the metal electrodes 101H, 101L have a substantially rectangular shape in plan view, and have the X direction (first direction) as the longitudinal direction (electrode formation direction), and the Y direction (second direction) crossing at a right angle to the X direction as an electrode facing direction. The metal electrodes 101H, 101L face each other along the Y direction. The metal electrodes 101H, 101L are equal to each other in size in plan view, and are symmetrically disposed with the central region R60 as the center. However, the widths of the metal electrodes 101H, 101L in the short direction (Y direction) and in the longitudinal direction (X direction) are set to be slightly shorter than those of the metal electrodes 201H, 201L. The metal electrodes 101H, 101L can be formed on the upper surface of the dielectric electrode 111 by the metalization treatment as with the metal electrodes 201H, 201L.

Figure 6:
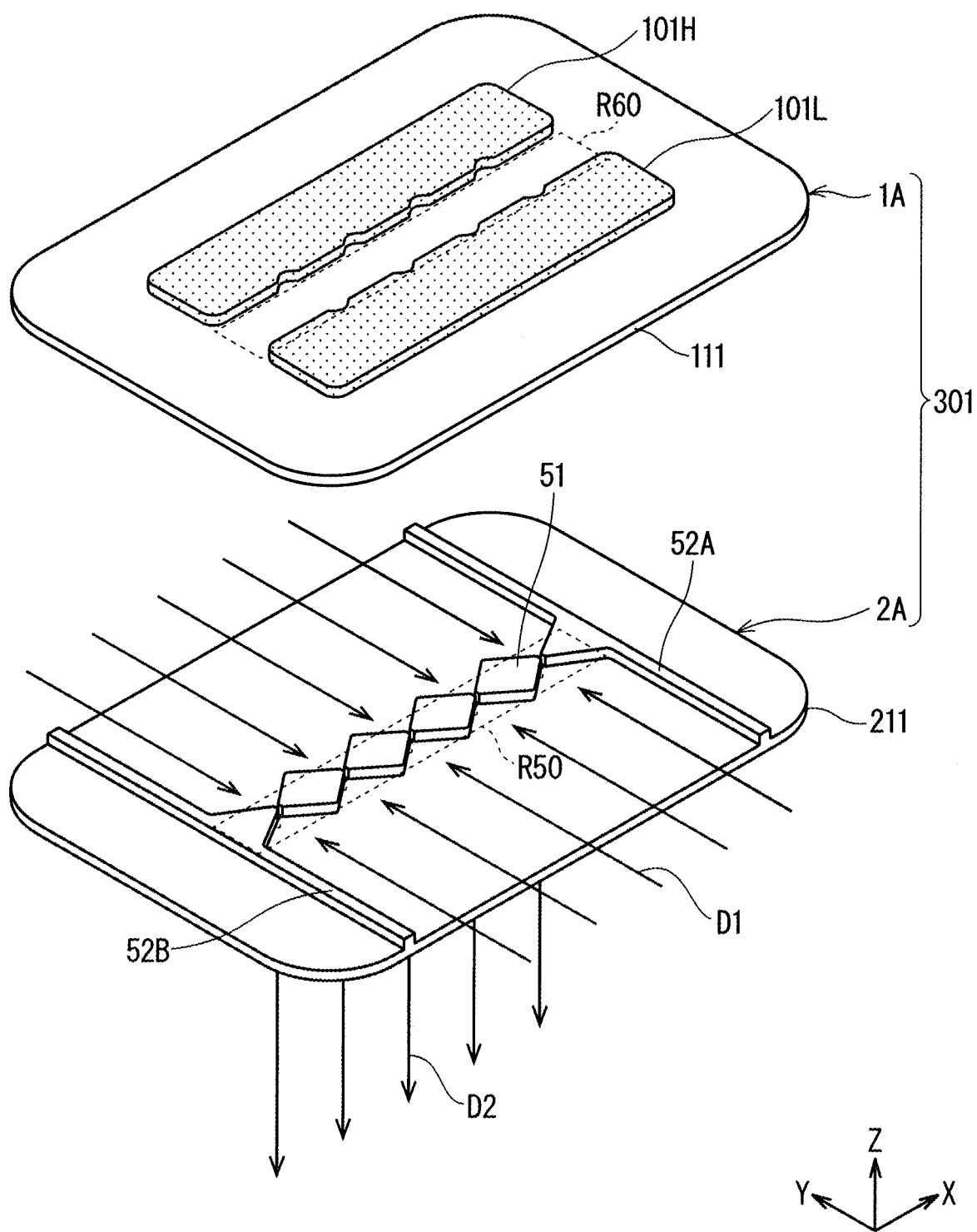
FIG. 6 is a perspective view (part 1) showing an assembling process of the high-voltage side electrode constituent part and the ground side electrode constituent part.
Figure 7:
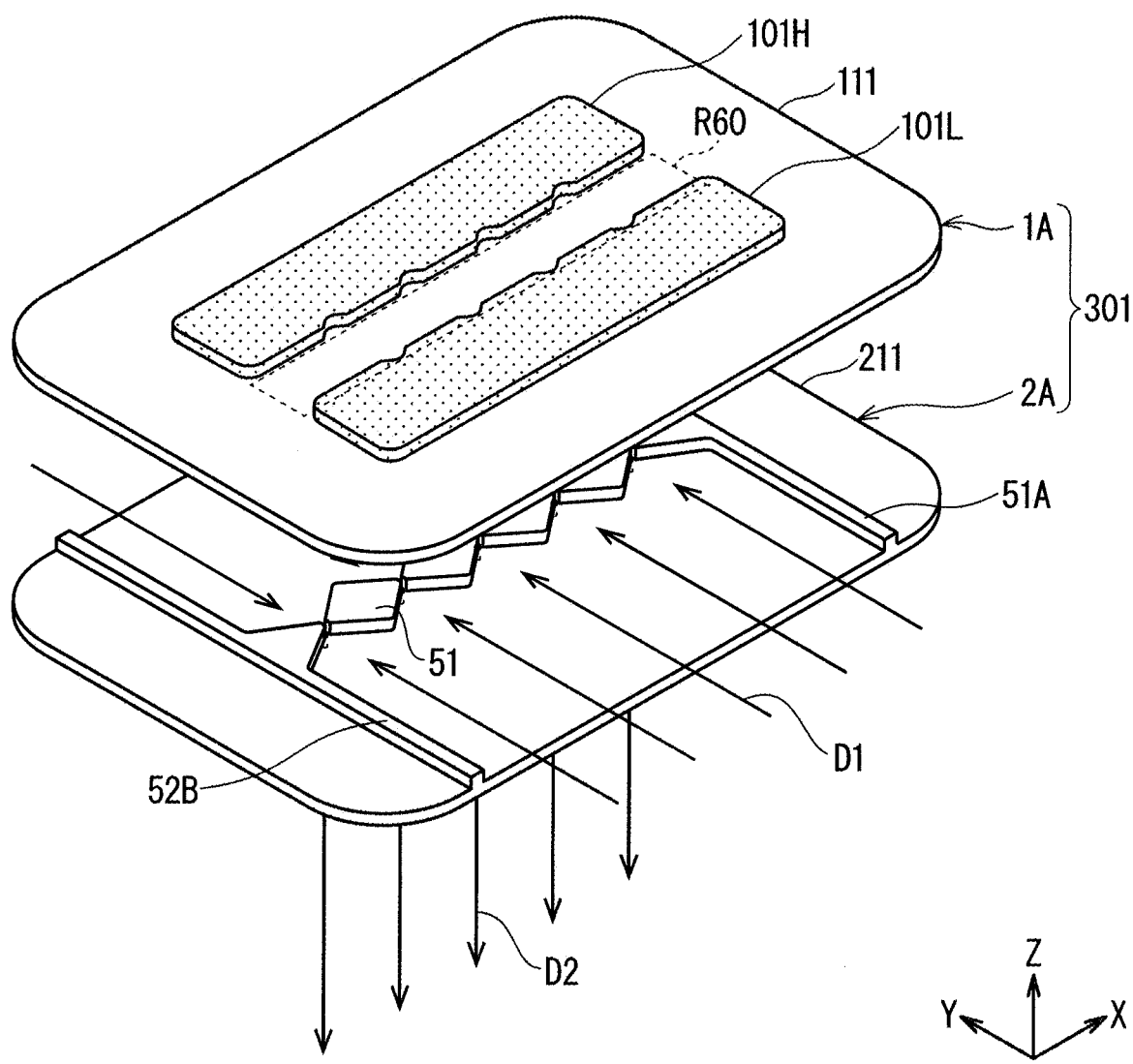
FIG. 7 is a perspective view (part 2) showing the assembling process of the high-voltage side electrode constituent part and the ground side electrode constituent part.
Figure 8:
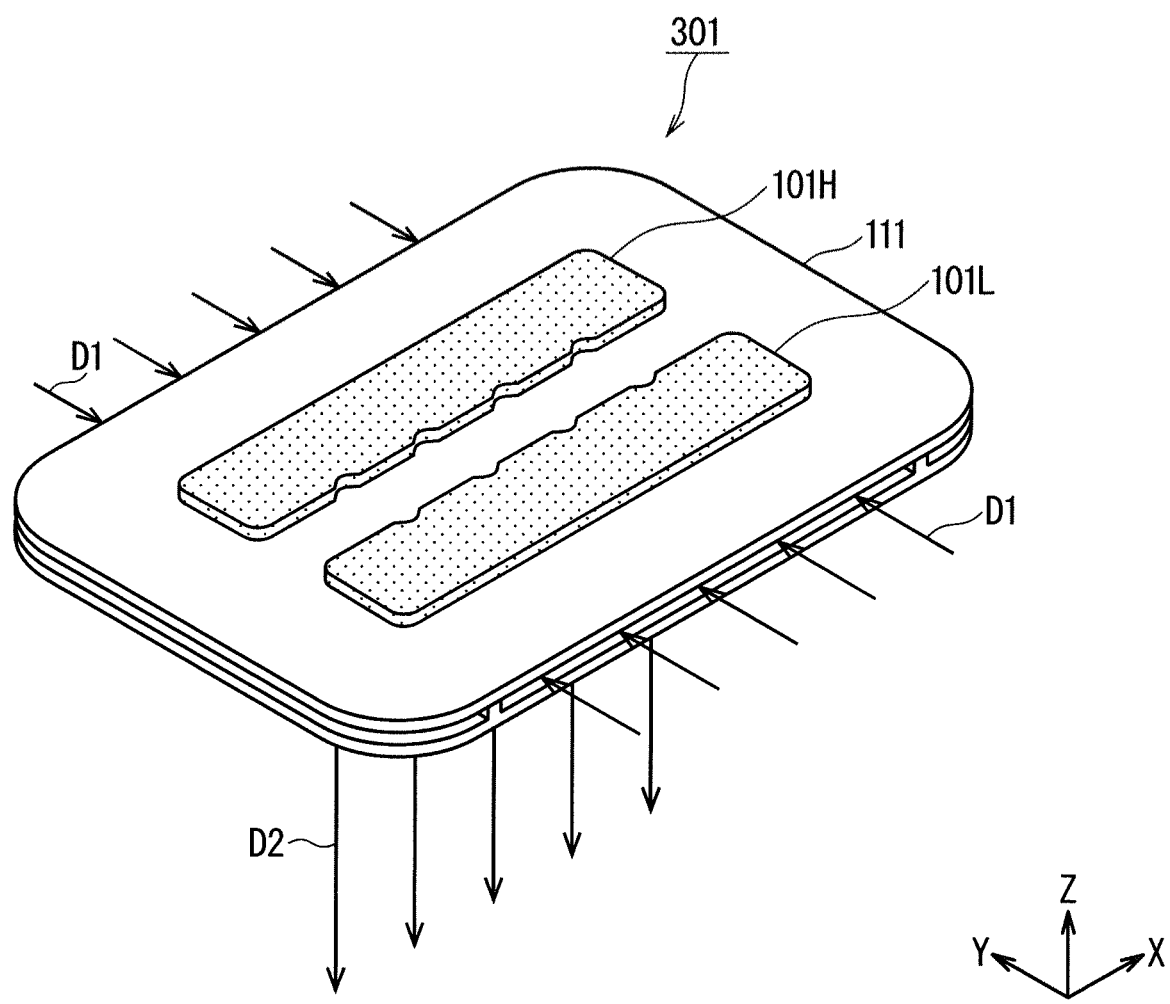
FIG. 8 is a perspective view (part 3) showing the assembling process of the high-voltage side electrode constituent part and the ground side electrode constituent part.

FIGS. 6 to 8 are perspective views showing an assembling process of the high-voltage side electrode constituent part 1A and the ground side electrode constituent part 2A. In FIGS. 6 to 8, an XYZ coordinate system is shown. In FIGS. 6 to 8, the illustration of the above-mentioned change in the film thickness of the dielectric electrode 111 and inclination of the upper surface is omitted for convenience of explanation.

As shown in FIG. 6, an activated gas generating electrode group 301 can be assembled by disposing the high-voltage side electrode constituent part 1A on the ground side electrode constituent part 2A. As shown in FIGS. 6 and 7, while the central region R60 of the dielectric electrode 111 in the high-voltage side electrode constituent part 1A and the central region R50 of the dielectric electrode 211 in the ground side electrode constituent part 2A are positioned so as to overlap with each other in plan view, the high-voltage side electrode constituent part 1A is stacked on the ground side electrode constituent part 2A for assembling, so that the activated gas generating electrode group 301 can be finally completed as shown in FIG. 8.

In the dielectric space in which the dielectric electrode 111 and the dielectric electrode 211 constituting the activated gas generating electrode group 301 face each other, a region in which the metal electrodes 101H, 101L and the metal electrodes 201H, 201L overlap with each other in plan view is defined as a discharge space.

The metal electrodes 101H, 101L and the metal electrodes 201H, 201L which are metalization parts are connected to the (high voltage) high frequency power supply 5 as in the metal electrodes 10, 20 shown in FIG. 16. The metal electrodes 201H, 201L of the ground side electrode constituent part 2A are grounded. In the present embodiment, a 0 peak value is fixed at 2 to 10 kV from the high frequency power supply 5, and an AC voltage set at a frequency of 10 kHz to 100 kHz is applied between the metal electrodes 101H, 101L and the metal electrodes 201H, 201L.

As described above, unlike the dielectric electrode 211 of the ground side electrode constituent part 2A, the dielectric electrode 111 of the high-voltage side electrode constituent part 1A has upper and bottom surfaces each having nothing. Therefore, when the high-voltage side electrode constituent part 1A is combined with the ground side electrode constituent part 2A, the high-voltage side electrode constituent part 1A and the ground side electrode constituent part 2A are merely fixed from the upper side to the ground side electrode constituent part 2A side by a fastening force such as a spring or a bolt or the like. The high-voltage side electrode constituent part 1A and the ground side electrode constituent part 2A are not positioned by forming a counter boring shape or the like, which can provide the activated gas generating electrode group 301 which minimizes the possibility of occurrence of contamination due to the contact between the end faces of the dielectric electrode 111 and the dielectric electrode 211 during transportation or the like.

The discharge space (discharge field) described above cannot be brought close to the gas spray holes 55 by a certain interval or more in order to suppress abnormal discharge. Therefore, the space above the central region R50 (R60) from the discharge space to the gas spray holes 55 becomes a non-discharge space (non-discharge field, dead space). In the non-discharge space, an activated gas is merely decreased without being generated.

When the activated gas is generated in the discharge space, and passes through the discharge space, the activated gas is rapidly attenuated because of its high energy, and annihilates in a short time. In the case of the attenuation mechanism of activated gas that loses energy due to collision with other molecules in a ground state or the like, the rate of annihilation of the activated gas can be suppressed by simply lowering a pressure to merely lower a collision frequency. That is, it is important to promptly spray the activated gas generated in the discharge space near the atmospheric pressure to the subsequent film formation treatment chamber under reduced pressure. Therefore, the width in the Y direction of the central region R50 (R60) defining the non-discharge space described above is desirably made to be as narrow as possible.

The discharge space cannot be brought close to the gas spray holes 55 in order to minimize the non-discharge space. This is because abnormal discharge may occur when the activated gas is generated if the gas spray holes 55 are brought too close to the discharge space. Therefore, in order to fill the non-discharge space, the activated gas generation apparatus of the first embodiment is characterized in that a wedge-shaped stepped part 51 (central region step part) projects upward in the central region R50 of the upper surface of the dielectric electrode 211, and is integrally formed as the constituent element of the dielectric electrode 211.

That is, the wedge-shaped stepped part 51 is formed so as to have a shorter formation width in the Y direction (second direction) as approaching each of the plurality of gas spray holes 55 in plan view without overlapping with the plurality of gas spray holes 55 in plan view. Specifically, the wedge-shaped stepped part 51 is formed by an aggregate of four rhombic shaped single body parts 51s (see FIG. 3A) which are formed in a rhombic shape in plan view between the five gas spray holes 55 and are discrete from each other, and two triangular single body parts 51t (see FIG. 3A) each having an approximately isosceles triangular shape in plan view provided outside the gas spray holes 55 on both ends among the five gas spray holes 55.

Therefore, the source gas is supplied from the outside toward above the central region R50 (below the central region R60) in the dielectric space along the Y direction (gas supply direction D1 shown in FIGS. 6 to 8), so that the activated gas obtained when the source gas passes through the discharge space can be generated, and sprayed from the plurality of gas spray holes 55 to the outside along a −Z direction (gas spray direction D2 shown in FIGS. 6 to 8).

In this case, the presence of the wedge-shaped stepped part 51 (central region step part) having four rhombic shaped single body parts 51s and two triangular single body parts 51t each discretely formed so as to have a shorter formation width in the Y direction as approaching each of the plurality of gas spray holes 55 allows a plurality of gas flow paths of the activated gas corresponding to the plurality of gas spray holes 55 to be narrowed down above the central region R50 (below the central region R60) in the dielectric space. As a result, the activated gas generation apparatus of the first embodiment can increase gas flow rate in each of the gas spray holes 55. As a result, a higher-density activated gas can be generated.

Needless to say, in addition to the planar shape such as that of the wedge-shaped stepped part 51, the planar shape may be, for example, a semicircular shape, and as long as the planar shape is a shape formed so as to have a shorter formation width in the Y direction (second direction) as approaching each of the gas spray holes 55 in plan view without overlapping with the plurality of gas spray holes 55 in plan view, the above effect can be achieved.

Examples of the source gas include a gas containing at least one of nitrogen, oxygen, fluorine, and hydrogen. That is, an aspect of supplying a gas such as oxygen, rare gases, hydrogen, or fluorines as the source gas is considered. These source gases advance from an outer peripheral part of the activated gas generating electrode group 301 to an inside along the gas supply direction D1, and become the activated gas via the discharge space. The activated gas (gas containing radicals) is sprayed from the plurality of gas spray holes 55 provided in the dielectric electrode 211 to the subsequent film formation treatment chamber along the gas spray direction D2. By using the highly reactive activated gas in the film formation treatment chamber, the wafer as a substrate to be treated can be subjected to a film-formation treatment. The activated gas contains a plurality of partial activated gases sprayed from the plurality of gas spray holes 55.

As described above, a higher-density activated gas can be generated from the source gas containing at least one of nitrogen, oxygen, fluorine, and hydrogen.

The wedge-shaped stepped part 51 is provided on the upper surface of not the dielectric electrode 111 of the high-voltage side electrode constituent part 1A but the dielectric electrode 211 of the ground side electrode constituent part 2A. That is, the plurality of gas spray holes 55 and the wedge-shaped stepped part 51 are formed in the same dielectric electrode 211. As shown in FIGS. 6 to 8, this eliminates the need for positioning the plurality of gas spray holes 55 and the wedge-shaped stepped part 51 when the activated gas generating electrode group 301 is assembled, and can also achieve the simplification of the apparatus configuration.

The wedge-shaped stepped part 51 also functions as a spacer defining a gap length (a distance in a Z direction between the dielectric electrode 111 and the dielectric electrode 211) in the discharge space between the high-voltage side electrode constituent part 1A and the ground side electrode constituent part 2A.

The wedge-shaped stepped part 51 also functions as a spacer defining a gap length (a distance in a Z direction between the dielectric electrode 111 and the dielectric electrode 211) in the discharge space between the high-voltage side electrode constituent part 1 and the ground side electrode constituent part 2.

Therefore, as shown in FIGS. 6 to 8, by a formation height of the wedge-shaped stepped part 51 according to a simple assembling process of laminating the high-voltage side electrode constituent part 1A on the ground side electrode constituent part 2A, the gap length in the discharge space can be set.

Conventionally, the spacer is often formed in the discharge space. In this case, creeping discharge going through the side face of the spacer occurs, which causes discharge loss and contamination occurrence. In the present embodiment, the wedge-shaped stepped part 51 provided so as to protrude on the upper surface of the dielectric electrode 211 is provided in the central region R50 outside the discharge space, so that the wedge-shaped stepped part 51 leads to the suppression of the contamination occurrence or the like.

As shown in FIGS. 1 to 3, in a boundary region between the main region 53 and the end regions 54A, 54B present on both end sides, the dielectric electrode 211 further includes the linear stepped parts 52A, 52B (a pair of end region step parts) formed so as to protrude upward. The linear stepped parts 52A, 52B are formed so as to extend in the Y direction over the entire length in the short direction of the dielectric electrode 211 in plan view. The gap length in the discharge space is defined by the formation heights of the linear stepped parts 52A, 52B together with the formation height of the wedge-shaped stepped part 51.

The presence of the linear stepped parts 52A, 52B regulates the inflow of the gas into the discharge space from both the end parts in the X direction of the dielectric electrode 211. When the gas can flow in from both the end parts of the dielectric electrode 211, the gas spray holes 55 (the gas spray hole 55 present on the rightmost or leftmost side in FIG. 1) near both the end parts of the dielectric electrode 211 are apt to be influenced by the inflow amount of the activated gas, so that the calculation of the gas flow rate of the activated gas from each of the gas spray holes 55 is complicated, which causes a problem of difficult control. The problem is eliminated by providing the linear stepped parts 52A, 52B.

By providing the linear stepped parts 52A, 52B, a gas inflow path between the high-voltage side electrode constituent part 1A and the ground side electrode constituent part 2A is provided only from two surfaces in the Y direction. Therefore, the gas flow itself is relatively stabilized, so that a pressure distribution in the discharge space is constant, which can provide a uniform discharge space.

As described above, the dielectric electrode 211 further includes the linear stepped parts 52A, 52B, so that, even in the gas spray hole 55 close to both the end parts in the X direction among the plurality of gas spray holes 55, the influence of the inflow of an unintended gas or the like from both the end parts causes no phenomenon that the inflow amount of the activated gas changes. This makes it possible to spray the activated gas without causing variations among the plurality of gas spray holes 55. As a result, the pressure distribution is constant, and the flow rates of the plurality of gas spray holes 55 may be equal to each other.

Figure 4:
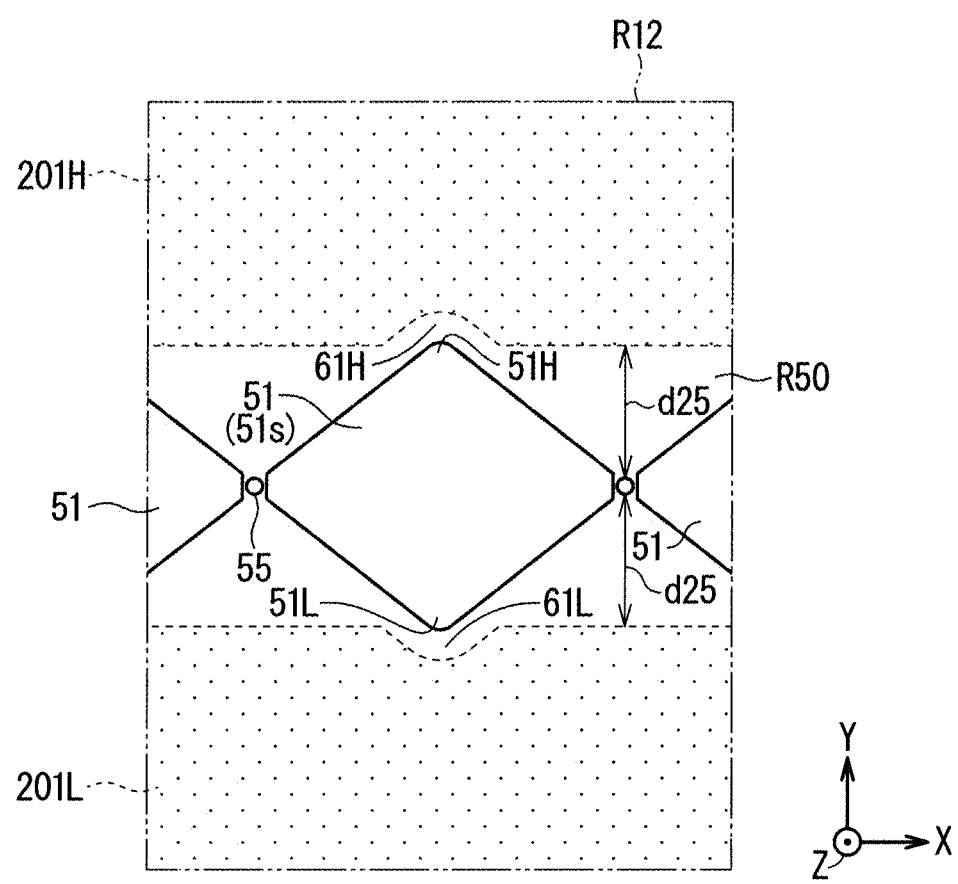
FIG. 4 is an enlarged top view of the focused region of FIGS. 2A to 2D.

As shown in FIG. 4 described later, a non-discharge distance d25 which is a distance in the Y direction between the discharge space (end parts on the central region R50 side of the metal electrodes 201H, 201L) and the plurality of gas spray holes 55 is set to 10 mm or more.

As described above, the non-discharge distance d25 is set to 10 mm or more, which makes it possible to hardly occur abnormal discharge when the activated gas is generated.

FIG. 4 is an enlarged top view of a focused region R12 of FIG. 2A. In FIG. 4, an XYZ coordinate system is appropriately shown. As shown in FIG. 4, in order to minimize the non-discharge space, end parts 51H, 51L providing the longest formation length in the Y direction of the wedge-shaped stepped part 51 extend to positions adjacent to the metal electrodes 201H, 201L forming the discharge space. When the end parts 51H, 51L of the wedge-shaped stepped part 51 and the metal electrodes 201H, 201L overlap with each other, abnormal discharge may be induced when the activated gas is generated, so that cutout parts 61H, 61L having a substantially triangular shape in plan view are provided in regions corresponding to the end parts 51H, 51L in the metal electrodes 201H, 201L defining the discharge space. As a result, a predetermined reference distance (for example, 2 to 3 mm) is secured between the wedge-shaped stepped part 51 and the metal electrodes 201H, 201L.

Similarly, as shown in FIGS. 5A and 5B, the metal electrodes 101H, 101L also have cutout parts 71H and 71L at positions corresponding to the end parts 51H, 51L.

As described above, the planar shapes of the metal electrodes 101H, 101L and the metal electrodes 201H, 201L are set so that a shortest distance in plan view between the discharge space defined by the overlapping area in plan view of the metal electrodes 101H, 101L and the metal electrodes 201H, 201L, and the wedge-shaped stepped part 51 is equal to or greater than a predetermined reference distance, which makes it possible to prevent abnormal discharge from occurring when the activated gas is generated.

As described above, the widths of the metal electrodes 101H, 101L in the short direction (Y direction) and the longitudinal direction (X direction; electrode formation direction) are set to be slightly shorter than those of the metal electrodes 201H, 201L, so that planar shapes of the metal electrodes 101H, 101L and the metal electrodes 201H, 201L are partially different from each other.

As a result, the occurrence of abnormal discharge which is apt to occur on the end faces of the metal electrodes 101H, 101L or the metal electrodes 201H, 201L can be suppressed.

When the above effect is not emphasized, the planar shapes of the metal electrodes 101H, 101L and the metal electrodes 201H, 201L may be perfectly matched to each other.

Furthermore, among the high-voltage side electrode constituent part 1A and the ground side electrode constituent part 2A (in particular, the dielectric electrodes 111, 211), a gas contacting region which is a region brought into contact with the activated gas is desirably formed of quartz, alumina, silicon nitride, or aluminum nitride as a constituent material.

The surface formed of the constituent material is a chemically stable substance against the activated gas, so that the activated gas can be sprayed from the gas spray holes in a state where the deactivation of the activated gas is suppressed at the gas contacting region brought into contact with the activated gas.

As the basic configuration, the plurality of gas spray holes 55 are formed so as to be equal to each other in shape (diameter when being formed in a circular shape).

On the other hand, a modified configuration is also considered, in which the shapes (diameters) of the plurality of gas spray holes are set to be different from each other between the plurality of gas spray holes 55.

When the modified configuration is adopted in the activated gas generation apparatus of the first embodiment, the activated gas generation apparatus can exhibit an effect of setting the spray amount to different contents between the plurality of gas spray holes 55. This modified configuration will be described later in detail.

(Dielectric Electrode 111)

As shown in FIG. 5B, the dielectric electrode 111 which is one dielectric electrode being one of the dielectric electrodes 111 and 211 has a film thickness changing structure in which a film thickness is changed along the X direction which is the electrode formation direction.

Here, the positions of the five gas spray holes 55 in the X direction are taken as spray hole positions P1 to P5 from the right side (+X side). The discharge space can be classified into five first to fifth partial discharge spaces corresponding to the spray hole positions P1 to P5. That is, the i-th (any of i=1 to 5) partial discharge space is a space including the spray hole position Pi and its vicinity along the X direction in the discharge space. The first to fifth partial discharge spaces are not divided at all in the discharge space.

As described above, the discharge space can be classified into a plurality of partial discharge spaces corresponding to the positions of the plurality of gas spray holes 55 in the electrode formation direction (X direction).

Therefore, the activated gas generation apparatus of the first embodiment includes the dielectric electrode 111 having the above-described film thickness changing structure, whereby first to fifth partial discharge voltages in the first to fifth partial discharge spaces can be set to values different from each other.

FIG. 9 is an illustration diagram showing, in a table form, changes in a partial discharge voltage and a generated N concentration with the change in the film thickness of the dielectric electrode 111 of the first embodiment. FIG. 9 shows a case where nitrogen gas is used as the source gas 6 and radicalized nitrogen atoms are generated as the activated gas 7.

As shown in FIG. 9, it is assumed that three partial discharge spaces PD1, PD2, and PD3 are formed when the film thickness of the dielectric electrode 111 is 1 mm, 3 mm, and 6 mm.

The gap lengths of the partial discharge spaces PD1 to PD3 are the same, and are 1 mm. The gap pressures which are the pressures of the partial discharge spaces PD1 to PD3 are also the same, and are 30 kPa. The AC voltage which is the entire applied voltage is also common, and are 5000 V.

On the other hand, the partial discharge voltages of the partial discharge spaces PD1, PD2, and PD3 are changed to 4200 V, 3100 V, and 2300 V, and the generated N concentrations (generated nitrogen concentrations) in the activated gas 7 generated in the partial discharge spaces PD1, PD2, and PD3 are changed to 110 ppm, 80 ppm, and 50 ppm. The generated N concentration means the concentration of radicalized nitrogen atoms in the activated gas 7, that is, the concentration of the activated gas.

As shown in FIG. 9, the partial discharge voltage is inversely proportional to the film thickness of the dielectric electrode 111 among the partial discharge spaces PD1 to PD3. This is because, on the bottom surface of the dielectric electrode 111, the potential of a bottom surface having a relatively small film thickness is higher than that of a bottom surface having a relatively large film thickness by the small film thickness.

On the other hand, the generated N concentration is proportional to the partial discharge voltage, so that the generated N concentration in each of the partial discharge spaces PD1 to PD3 is higher in the order of the partial discharge spaces PD1, PD2, and PD3.

As shown in FIG. 9, the dielectric electrode 111 has the film thickness changing structure, and the film thickness (thickness) of the dielectric electrode 111 is changed among the partial discharge spaces PD1 to PD3, whereby a concentration gradient can be provided in the generated N concentration among the partial discharge spaces PD1 to PD3.

As described above, the film thickness changing structure of the dielectric electrode 111 causes the film thickness to be changed along the electrode formation direction (X direction) so that the plurality of partial discharge voltages generated in the plurality of partial discharge spaces when the AC voltage is applied from the high-frequency power supply 5 have values different from each other.

That is, the film thickness of the dielectric electrode 111 (the one dielectric electrode) becomes a discharge voltage contribution parameter, and the film thickness changing structure of the dielectric electrode 111 functions as a parameter changing structure in which the discharge voltage contribution parameter is changed.

The activated gas generation apparatus of the first embodiment having such a structure sprays the activated gas containing a plurality of partial activated gases sprayed from the plurality of gas spray holes 55 provided in the dielectric electrode 211 to the outside.

Therefore, in the activated gas generation apparatus of the first embodiment, by appropriately setting the film thickness difference between the thickness dA1 and the thickness dB1 in the dielectric electrode 111 and the arrangement of the plurality of gas spray holes 55, the concentration of the activated gas which is the concentration of atoms or molecules radicalized among the plurality of partial activated gases in the activated gas to be sprayed can be changed.

As described above, the activated gas generation apparatus of the first embodiment has the film thickness changing structure (parameter changing structure) in which the film thickness (discharge voltage contribution parameter) is changed along the electrode formation direction so that the plurality of partial discharge voltages generated in the plurality of partial discharge spaces when the AC voltage is applied have values different from each other.

The activated gas generation apparatus of the first embodiment has the characteristics, and thus can exhibit an effect of spraying the activated gas containing a plurality of partial activated gases having activated gas concentrations different from each other to the outside by applying one AC voltage from the high-frequency power supply 5 without dividing the discharge space into a plurality of parts.

Furthermore, the activated gas generation apparatus of the first embodiment adopts, as the parameter changing structure, the film thickness changing structure in which the film thickness of the dielectric electrode 111 is changed along the electrode formation direction (X direction). For this reason, the activated gas generation apparatus of the first embodiment has a relatively simple improved structure in which the film thickness of the dielectric electrode 111 which is the one dielectric electrode being one of the dielectric electrodes 111 and 211 is changed. Thus, the above-described effects can be achieved.

Furthermore, in the first embodiment, the structure in which the film thickness of the dielectric electrode 111 is continuously changed along the electrode formation direction is adopted as the film thickness changing structure. The structure has an advantage that the film thickness changing structure can be achieved by relatively simple setting, for example, by providing a significant difference between the film thicknesses at both ends of the dielectric electrode 111 along the electrode formation direction.

In addition, the activated gas generation apparatus of the first embodiment supplies the source gas 6 such as nitrogen gas from the outside along the electrode facing direction onto the central region R60 of the dielectric space to cause the source gas 6 to pass through the discharge space. Then, the activated gas containing a plurality of partial activated gases having activated gas concentrations different from each other can be sprayed to the outside from the plurality of gas spray holes 55 provided in the central region R50 of the dielectric electrode 211.

Here, there is considered a case in which a substrate is subjected to a film formation treatment using the activated gas in the film formation treatment chamber or the like disposed downstream of the activated gas generation apparatus.

In this case, the content of the film formation treatment largely depends on the absolute number (flux) per unit time as compared with the activated gas concentration. The flux means an activated gas amount per unit time (atms/sec) obtained from each gas spray hole 55.

That is, when the gas flow rate itself is very small even if the concentration of the activated gas is high, a long film formation time is required. Therefore, there is considered a modified configuration in which a substantial concentration difference among the plurality of partial activated gases, that is, a flux difference is provided by changing the gas flow rate per unit time sprayed among the plurality of gas spray holes 55.

As described above, there is considered a modified configuration in which the film thickness of the dielectric electrode 111 is made uniform and the hole diameter is changed in the plurality of gas spray holes 55 to change the gas flow rate among the plurality of gas spray holes 55.

However, in the modified configuration, a significant difference occurs in the gap pressure in the plurality of partial discharge spaces. This is because the pressure is decreased in the partial discharge space near the gas spray hole having a large hole diameter. The gap pressure largely changes the discharge state. At the same time, in the partial discharge space with a gap pressure of about 10 kPa to 30 kPa and a gap length of about 1 to 3 mm, discharge power also tends to be decreased as the pressure is decreased. For this reason, the increase in the gas flow rate is offset by the decrease in the discharge power, so that the modified configuration makes it very difficult to control the flux with high accuracy.

On the other hand, in the activated gas generation apparatus of the first embodiment, the state of the plurality of partial discharge spaces (discharge fields) is not changed at all, that is, the hole diameters of the plurality of gas spray holes 55 are equal to each other, and the pressures of the plurality of partial discharge spaces are set to a constant gap pressure, whereby an activated gas concentration difference can be provided with high accuracy among the partial activated gases. This exhibits an effect which cannot be achieved from the changing structure.

Second Embodiment

Figure 10A:
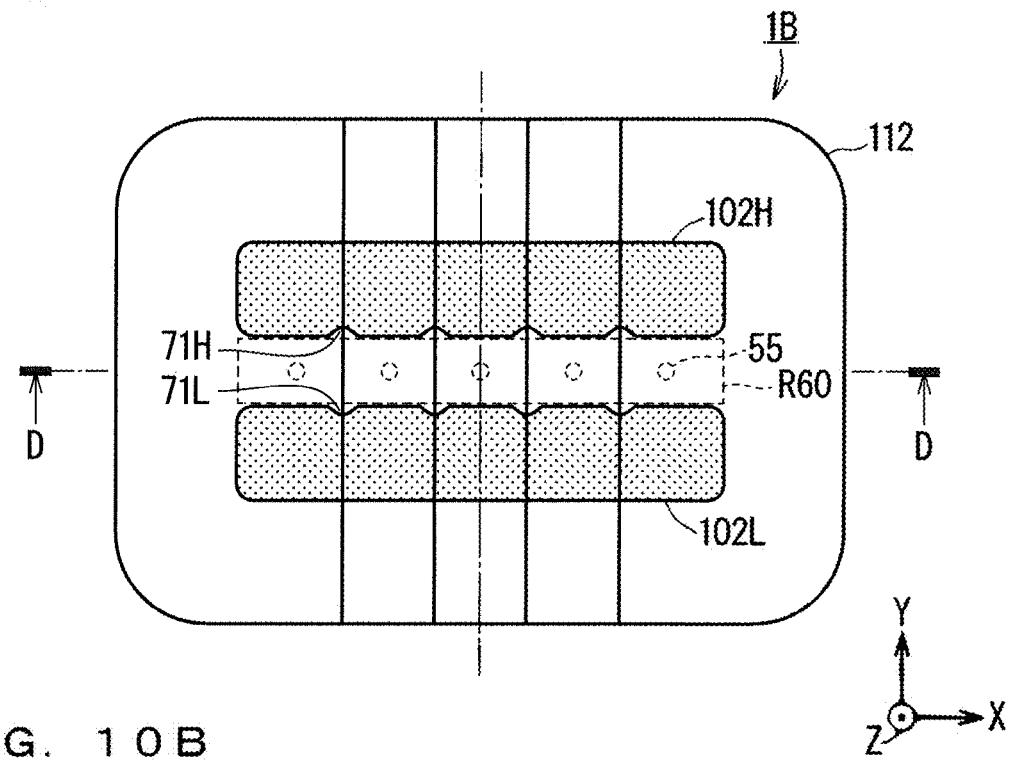
FIGS. 10A to 10C are illustration diagrams showing a structure of a high-voltage side electrode constituent part of an activated gas generation apparatus according to a second embodiment.
Figure 10B:
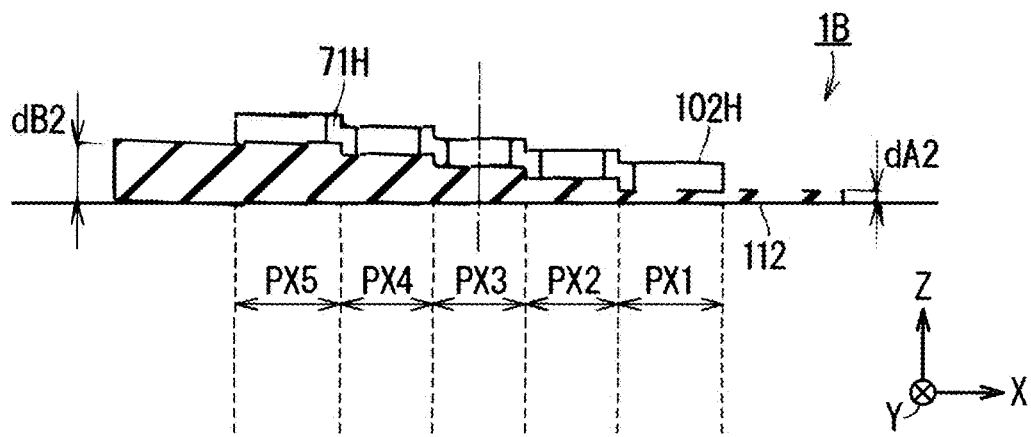
Figure 10C:
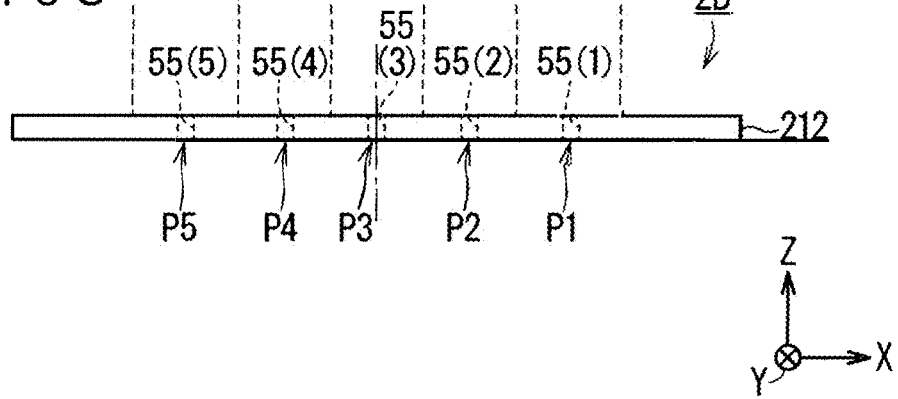

FIGS. 10A to 10C are illustration diagrams showing a structure of a high-voltage side electrode constituent part 1B of an activated gas generation apparatus according to a second embodiment of the present invention. FIG. 10A is a top view; FIG. 10B is a cross-sectional view taken along line D-D in FIG. 10A; and FIG. 10C is a cross-sectional view showing a cross-sectional structure of a dielectric electrode 212 in a ground side electrode constituent part 2B. In FIG. 10C, the illustration of metal electrodes 202H, 202L is omitted. In FIGS. 10A to 10C, an XYZ coordinate system is appropriately shown.

The activated gas generation apparatus of the second embodiment is different from that of the first embodiment in that a high-voltage side electrode constituent part 1A is replaced by a high-voltage side electrode constituent part 1B and a ground side electrode constituent part 2A is replaced by a ground side electrode constituent part 2B.

As shown in FIG. 10C, the dielectric electrode 212 has a plurality of gas spray holes 55 provided along an electrode formation direction in a central region R50 as with the dielectric electrode 211 of the first embodiment. As with the dielectric electrode 211, also in the dielectric electrode 212, a structure having a wedge-shaped stepped part 51 and linear stepped parts 52A, 52B may be adopted.

Although not shown in FIGS. 10A to 10C, the metal electrodes 202H, 202L formed on the bottom surface of the dielectric electrode 212 have a structure equivalent to that of metal electrodes 201H, 201L formed on the bottom surface of the dielectric electrode 211.

In FIG. 10C, the five gas spray holes 55 are identifiably shown as 55(1), 55(2), 55(3), 55(4) and 55(5) from the right side.

As shown in FIGS. 10A to 10C, the high-voltage side electrode constituent part 1B includes a dielectric electrode 112 and metal electrodes 102H, 102L formed on the upper surface of the dielectric electrode 112.

The dielectric electrode 112 has a rectangular flat plate structure in plan view with an X direction as a longitudinal direction and a Y direction as a short direction as with the dielectric electrode 111.

As shown in FIG. 10B, the dielectric electrode 112 has a structure in which a film thickness (thickness) is stepwise (discretely) changed along the X direction. The film thickness of the dielectric electrode 112 is uniform along the Y direction.

Specifically, as shown in FIG. 44(b) 10B, the film thickness of the right end (the end in the +X direction) of the dielectric electrode 112 is set to a thickness dA2, and the film thickness of the left end (the end in the −X direction) is set to a thickness dB2 (>dA2).

The film thickness of the dielectric electrode 112 is stepwisely increased from the right end (thickness dA2) to the left end (thickness dA2) along the X direction. Specifically, the film thickness is changed in five steps from the right end to the left end of the dielectric electrode 111.

As shown in FIG. 10B, the dielectric electrode 112 has five dielectric partial regions PX1 to PX5 as a plurality of dielectric partial regions having film thicknesses different from each other. The dielectric partial region PX1 is a region including a spray hole position P1 of the gas spray hole 55(1) present at the rightmost in the X direction which is the electrode formation direction.

The dielectric partial region PX2 is a region including a spray hole position P2 of the gas spray hole 55(2) which is second from the right in the X direction. The dielectric partial region PX3 is a region including a spray hole position P3 of the gas spray hole 55(3) which is third from the right in the X direction. The dielectric partial region PX4 is a region including a spray hole position P4 of the gas spray hole 55(4) which is fourth from the right in the X direction. The dielectric partial region PX5 is a region including a spray hole position P5 of the gas spray hole 55(5) which is present at the leftmost in the X direction.

In the dielectric electrode 112, the film thickness in the dielectric partial region PX1 is a thickness dA2; the film thickness in the dielectric partial region PX2 is a thickness dA2+$\Delta$z; the film thickness in the dielectric partial region PX3 is a thickness dA2+2·$\Delta$z; the film thickness in the dielectric partial region PX4 is a thickness dA2+3·$\Delta$z; and the film thickness in the dielectric partial region PX5 is a thickness dB1 (=thickness dA2+4·$\Delta$z). In the above-described example, the case where the steps between adjacent dielectric partial regions in the dielectric partial regions PX1 to PX5 are uniform, and are $\Delta$z is shown, but it is not always necessary to make the steps uniform. For example, the steps between the adjacent dielectric partial regions may be set to different values so that a desired activated gas concentration difference is obtained.

As described above, the dielectric electrode 112 is classified into the five dielectric partial regions PX1 to PX5 based on the five spray hole positions P1 to P5 where the plurality of gas spray holes 55 are provided, in the X direction which is the electrode formation direction. The film thickness is changed among the dielectric partial regions PX1 to PX5.

As shown in FIG. 10A, metal electrodes 102H, 102L (a pair of first partial metal electrodes; first metal electrode) are formed on the upper surface of the dielectric electrode 112, and are disposed so as to face each other with a central region R60 sandwiched therebetween. The central region R60 has a shape equal to that of the central region R50 of the dielectric electrode 212 in plan view. In this case, as with the metal electrodes 202H, 202L, the metal electrodes 102H, 102L have a substantially rectangular shape in plan view, and have the X direction (first direction) as the longitudinal direction (electrode formation direction), and the Y direction (second direction) crossing at a right angle to the X direction as an electrode facing direction. The metal electrodes 102H, 102L face each other along the Y direction.

The plurality of gas spray holes 55 shown in FIG. 10A are virtually shown at positions where the plurality of gas spray holes 55 present in the dielectric electrode 212 overlap with the dielectric electrode 112 in plan view, and are not actually formed in the dielectric electrode 112.

As shown in FIG. 10B, the metal electrodes 102H, 102L have a uniform thickness, and are formed in a five-step shape corresponding to the dielectric partial regions PX1 to PX5 of the dielectric electrode 111.

The other structural features of the metal electrodes 102H, 102L are the same as those of the metal electrodes 101H, 101L of the first embodiment, and thus description thereof will be omitted.

In the activated gas generation apparatus of the second embodiment, in the dielectric space in which the dielectric electrode 112 and the dielectric electrode 212 face each other, a region in which the metal electrodes 102H, 102L and the metal electrodes 202H, 202L overlap with each other in plan view is defined as a discharge space.

In the second embodiment, the discharge space is classified into first to fifth partial discharge spaces corresponding to the dielectric partial regions PX1 to PX5 in the dielectric electrode 212 along the X direction which is the electrode formation direction.

That is, in the dielectric partial region PXi (any of i=1 to 5), a region in which the metal electrodes 102H, 102L and the metal electrodes 202H, 202L overlap with each other in plan view is defined as an i-th partial discharge space. The first to fifth partial discharge spaces are not divided at all in the discharge space.

As described above, the discharge space can be classified into the first to fifth partial discharge spaces corresponding to the spray hole positions P1 to P5 of the plurality of gas spray holes 55 (five gas spray holes 55(1) to 55(5)) in the electrode formation direction (X direction).

Therefore, the activated gas generation apparatus of the second embodiment includes the dielectric electrode 112 having the above-described film thickness changing structure, and thus, the first to fifth partial discharge voltages in the first to fifth partial discharge spaces can be set to values different from each other as with the first embodiment.

As described above, in the film thickness changing structure of the dielectric electrode 112, the film thickness is changed along the electrode formation direction (X direction) so that the plurality of partial discharge voltages generated in the plurality of partial discharge spaces when the AC voltage is applied have values different from each other.

That is, the film thickness of the dielectric electrode 112 (the one dielectric electrode) becomes a discharge voltage contribution parameter, and the film thickness changing structure of the dielectric electrode 112 functions as a parameter changing structure in which the discharge voltage contribution parameter is changed.

The activated gas generation apparatus of the second embodiment having such a structure sprays the activated gas containing a plurality of partial activated gases sprayed from the plurality of gas spray holes 55 provided in the dielectric electrode 212 to the outside.

Therefore, in the activated gas generation apparatus of the second embodiment, by appropriately setting each of film thicknesses in the dielectric partial regions PX1 to PX5 of the dielectric electrode 112 and the arrangement of the plurality of gas spray holes 55, the concentration of the activated gas which is the concentration of atoms or molecules radicalized among the plurality of partial activated gases in the activated gas to be sprayed can be changed.

As described above, the activated gas generation apparatus of the second embodiment has the film thickness changing structure (parameter changing structure) in which the film thickness (discharge voltage contribution parameter) is changed along the electrode formation direction, as with the first embodiment.

The activated gas generation apparatus of the second embodiment has the characteristics, and thus can exhibit an effect of spraying the activated gas containing a plurality of partial activated gases having activated gas concentrations different from each other to the outside by applying one AC voltage from the high-frequency power supply 5 without dividing the discharge space into a plurality of parts, as with the first embodiment.

Furthermore, the activated gas generation apparatus of the second embodiment adopts, as the parameter changing structure, the film thickness changing structure in which the film thickness of the dielectric electrode 112 is changed along the electrode formation direction (X direction) as with the first embodiment. For this reason, the activated gas generation apparatus of the second embodiment has a relatively simple improved structure in which the film thickness of the dielectric electrode 112 which is one dielectric electrode being one of the dielectric electrodes 112 and 212 is changed. Thus, the above-described effects can be achieved.

In addition, in the second embodiment, a structure in which the film thickness is discretely changed among the dielectric partial regions PX1 to PX5 is adopted as the film thickness changing structure in the dielectric electrode 112. For this reason, the activated gas generation apparatus of the second embodiment can set a desired film thickness with high accuracy in each of the dielectric partial regions PX1 to PX5 in the dielectric electrode 112.

Furthermore, the discrete film thickness changing structure of the dielectric electrode 112, in which steps are provided among the dielectric partial regions PX1 to PX5, can provide shorter labor hour and lower cost than those of the continuous film thickness changing structure of the dielectric electrode 111.

The metal electrodes 102H, 102L are generally formed on the upper surface of the dielectric electrode 112 by using a film formation treatment method such as sputtering or a firing processing method by applying a metal paste, or the like. Care must be taken not to break at the steps among the dielectric partial regions PX1 to PX5.

Third Embodiment

Figure 11A:
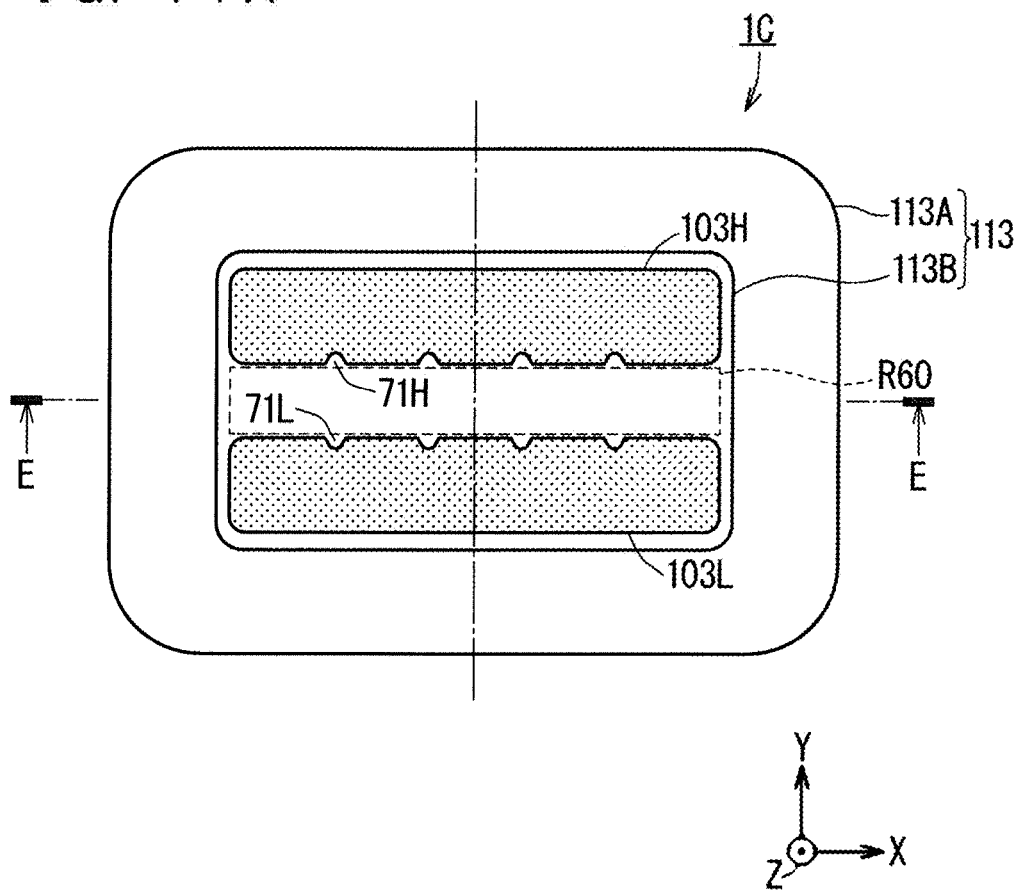
FIGS. 11A and 11B are illustration diagrams showing a structure of a high-voltage side electrode constituent part of an activated gas generation apparatus according to a third embodiment.
Figure 11B:
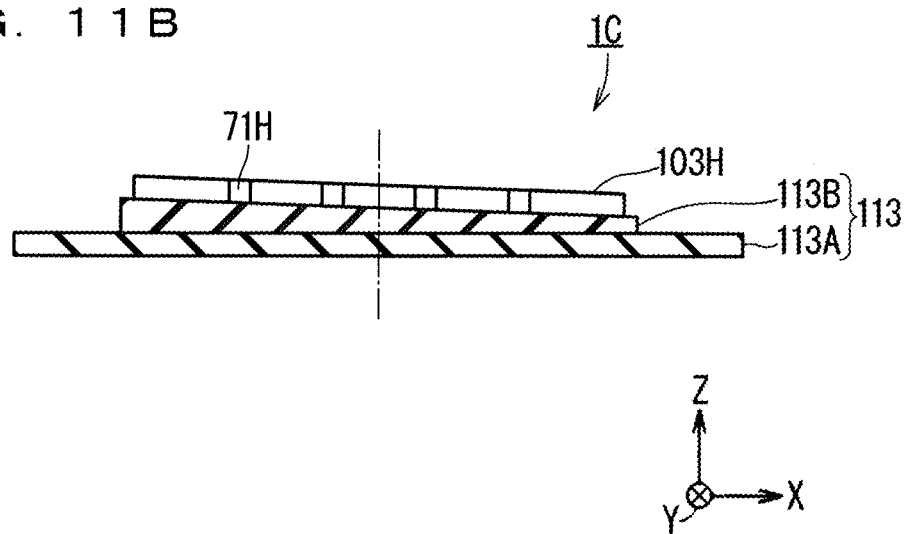

FIGS. 11A and 11B are illustration diagrams showing a structure of a high-voltage side electrode constituent part 1C of an activated gas generation apparatus according to a third embodiment of the present invention. FIG. 11A is a top view, and FIG. 11B is a cross-sectional view taken along line E-E in FIG. 11A.

Figure 12A:
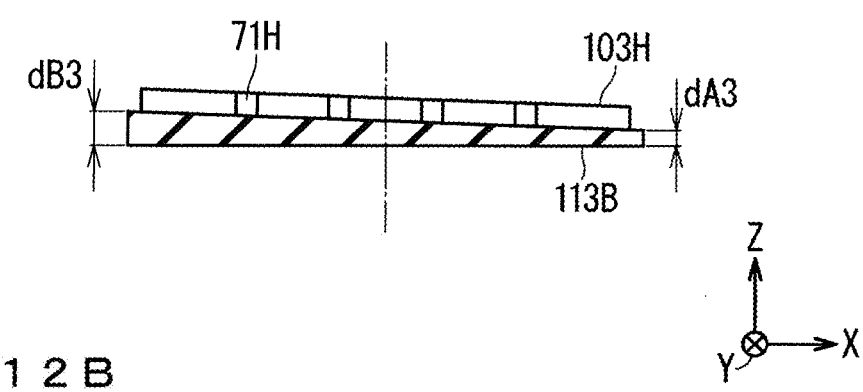
FIGS. 12A and 12B are exploded cross-sectional views showing the high-voltage side electrode constituent part shown in FIGS. 11A and 11B.
Figure 12B:
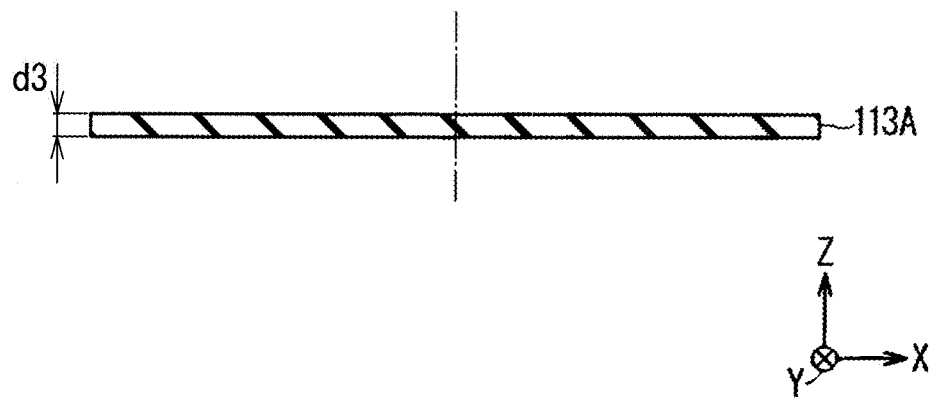

FIGS. 12A and 12B are exploded cross-sectional views showing the high-voltage side electrode constituent part 1C, and shows the cross-sectional view taken along line E-E in FIG. 11A. FIG. 12A is a cross-sectional view of a laminated structure of a partial dielectric electrode 113B and a metal electrode 103H, and FIG. 12B is a cross-sectional view of the cross-sectional structure of a partial dielectric electrode 113A. In each of FIGS. 11 and 12, an XYZ coordinate system is appropriately shown.

The activated gas generation apparatus of the third embodiment is different from that of the first embodiment in that a high-voltage side electrode constituent part 1A is replaced by the high-voltage side electrode constituent part 1C, and a ground side electrode constituent part 2A is replaced by a ground side electrode constituent part 2C.

Although not shown, the ground side electrode constituent part 2C has the same structure as that of the ground side electrode constituent part 2A of the first embodiment. That is, the ground side electrode constituent part 2C includes a dielectric electrode 213 and metal electrodes 203H, 203L. The dielectric electrode 213 has the same structure as that of a dielectric electrode 211. The metal electrodes 203H, 203L have the same structure as that of metal electrodes 201H, 201L. The metal electrodes 203H, 203L are provided on the bottom surface of the dielectric electrode 213 with the same contents as those of the metal electrodes 201H, 201L.

The ground side electrode constituent part 2C may be formed to have the same configuration as that of the ground side electrode constituent part 2B of the second embodiment. That is, in the ground side electrode constituent part 2C, the dielectric electrode 213 may have the same structure as that of the dielectric electrode 212.

As shown in FIGS. 11A and 11B, the high-voltage side electrode constituent part 1C includes a dielectric electrode 113 and metal electrodes 103H, 103L formed on the upper surface of the dielectric electrode 113.

As shown in FIG. 11A, the dielectric electrode 113 has a rectangular flat plate structure in plan view with an X direction as a longitudinal direction and a Y direction as a short direction as with the dielectric electrode 111.

As shown in FIG. 11B, the dielectric electrode 113 (the one dielectric electrode) includes a partial dielectric electrode 113A which is a first lamination partial dielectric electrode and a partial dielectric electrode 113B which is a second lamination partial dielectric electrode formed on the partial dielectric electrode 113A. Therefore, the dielectric electrode 113 has a laminated structure including the partial dielectric electrodes 113A and 113B.

As shown in FIGS. 11 and 12, the partial dielectric electrode 113A has a uniform film thickness, and the partial dielectric electrode 113B has a film thickness changing structure in which a film thickness is continuously changed as with the dielectric electrode 111 of the first embodiment.

Specifically, as shown in FIG. 12A, the film thickness of the right end (the end in the +X direction) of the dielectric electrode 113B is set to a thickness dA3, and the thickness of the left end (the end in the −X direction) is set to a thickness dB3 (>dA3). On the other hand, as shown in FIG. 12B, the partial dielectric electrode 113A is set to have a uniform thickness d3.

Therefore, the film thickness of the partial dielectric electrode 113B is continuously increased from the right end (thickness dA3) to the left end (thickness dB3) along the X direction. As a result, the entire film thickness of the dielectric electrode 113 is continuously increased from the right end (thickness dA3+d3) to the left end (thickness dB3+d3) along the X direction. Therefore, the upper surface of the dielectric electrode 113 (partial dielectric electrode 113B) has a constant inclination with respect to the horizontal direction (X direction).

Here, if "dA3+d3=dA1" and "dB3+d3=dB1" are set, the dielectric electrode 113 has a structure equivalent to that of the dielectric electrode 111 of the first embodiment with respect to the film thickness.

As shown in FIGS. 11B and 12A, the dielectric electrode 113 (the one dielectric electrode) having the partial dielectric electrode 113B has a film thickness changing structure in which a film thickness is continuously changed along the direction X which is the electrode formation as with the dielectric electrode 111.

Metal electrodes 103H, 103L (a pair of first partial metal electrodes; first metal electrode) are formed on the upper surface of the dielectric electrode 113 (partial dielectric electrode 113B), and are disposed so as to face each other with a central region R60 sandwiched therebetween. The central region R60 has a shape equal to that of the central region R50 of the dielectric electrode 213 in plan view. In this case, as with the metal electrodes 203H, 203L, the metal electrodes 103H, 103L have a substantially rectangular shape in plan view, and have the X direction (first direction) as the longitudinal direction (electrode formation direction), and the Y direction (second direction) crossing at a right angle to the X direction as an electrode facing direction. The metal electrodes 103H, 103L face each other along the Y direction.

In the activated gas generation apparatus of the third embodiment, in the dielectric space in which the dielectric electrode 113 and the dielectric electrode 213 face each other, a region in which the metal electrodes 103H, 103L and the metal electrodes 203H, 203L overlap with each other in plan view is defined as a discharge space.

Therefore, in the activated gas generation apparatus of the third embodiment, the discharge space can be classified into five first to fifth partial discharge spaces along the X direction as with the first embodiment. That is, the i-th (any of i=1 to 5) partial discharge space is a space including the spray hole position Pi and its vicinity in the discharge space. The first to fifth partial discharge spaces are not divided at all in the discharge space.

As described above, the discharge space can be classified into a plurality of partial discharge spaces corresponding to the positions of the plurality of gas spray holes 55 in the electrode formation direction (X direction).

Therefore, the activated gas generation apparatus of the third embodiment includes the dielectric electrode 113 (partial dielectric electrode 113B) having the above-described film thickness changing structure, whereby first to fifth partial discharge voltages in the first to fifth partial discharge spaces can be set to values different from each other as with the first embodiment.

As described above, the film thickness changing structure of the dielectric electrode 113 (partial dielectric electrode 113B) causes the film thickness to be changed along the electrode formation direction (X direction) so that the plurality of partial discharge voltages generated in the plurality of partial discharge spaces when the AC voltage is applied have values different from each other.

That is, the film thickness of the dielectric electrode 113 (the one dielectric electrode) becomes a discharge voltage contribution parameter, and the film thickness changing structure of the dielectric electrode 113 functions as a parameter changing structure in which the discharge voltage contribution parameter is changed.

The activated gas generation apparatus of the third embodiment having such a structure sprays the activated gas containing a plurality of partial activated gases sprayed from the plurality of gas spray holes 55 provided in the dielectric electrode 213 to the outside.

Therefore, in the activated gas generation apparatus of the third embodiment, by appropriately setting the film thickness of the partial dielectric electrode 113A, the film thickness difference between the thicknesses dA3 and dB3 of the partial dielectric electrode 113B, and the arrangement of the plurality of gas spray holes 55, the concentration of the activated gas can be changed among the plurality of partial activated gases in the activated gas to be sprayed.

As described above, the activated gas generation apparatus of the third embodiment has the film thickness changing structure (parameter changing structure) in which the film thickness (discharge voltage contribution parameter) is changed along the electrode formation direction, as with the first and second embodiments.

The activated gas generation apparatus of the third embodiment has the characteristics, and thus can exhibit an effect of spraying the activated gas containing a plurality of partial activated gases having activated gas concentrations different from each other to the outside by applying one AC voltage from the high-frequency power supply 5 without dividing the discharge space into a plurality of parts.

Furthermore, the activated gas generation apparatus of the third embodiment adopts, as the parameter changing structure, the film thickness changing structure in which the film thickness of the partial dielectric electrode 113B in the dielectric electrode 113 is changed along the electrode formation direction (X direction), whereby the above-described effects can be achieved by a relatively simple improved structure in which the film thickness of the dielectric electrode 113 which is one dielectric electrode being one of the dielectric electrodes 113, 213 is changed.

Furthermore, in the third embodiment, a structure in which the film thickness of the partial dielectric electrode 113B is continuously changed along the electrode formation direction is adopted as the film thickness changing structure. The structure has an advantage that the film thickness changing structure can be achieved by relatively simple setting, for example, by providing a significant difference between the film thicknesses at both ends of the partial dielectric electrode 113B along the electrode formation direction.

In addition, in the third embodiment, the dielectric electrode 113 has a laminated structure of the partial dielectric electrode 113A and the partial dielectric electrode 113B.

For this reason, in the activated gas generation apparatus of the third embodiment, only by newly adding the partial dielectric electrode 113B as the second lamination partial dielectric electrode while using the existing dielectric electrode as the partial dielectric electrode 113A which is the first lamination partial dielectric electrode, the film thickness changing structure can be achieved as the dielectric electrode 113. As a result, the activated gas generation apparatus of the third embodiment can be relatively inexpensively obtained.

Fourth Embodiment

Figure 13A:
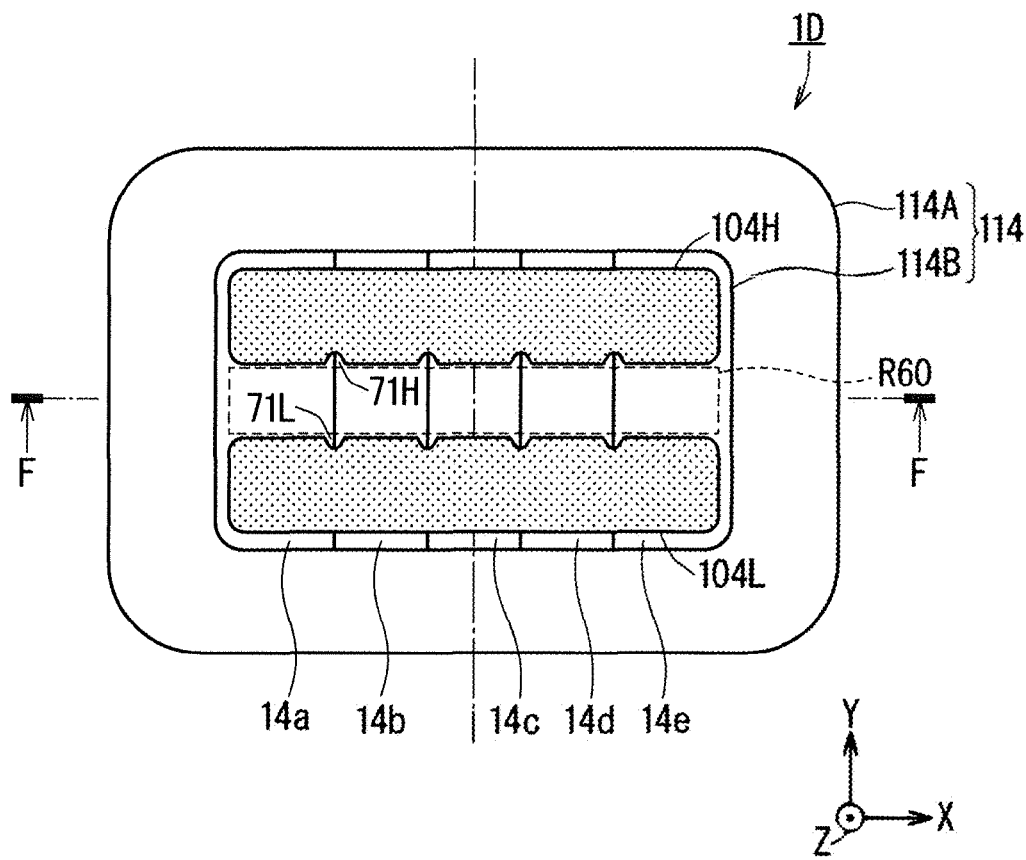
FIGS. 13A and 13B are illustration diagrams showing a structure of a high-voltage side electrode constituent part of an activated gas generation apparatus according to a fourth embodiment.
Figure 13B:
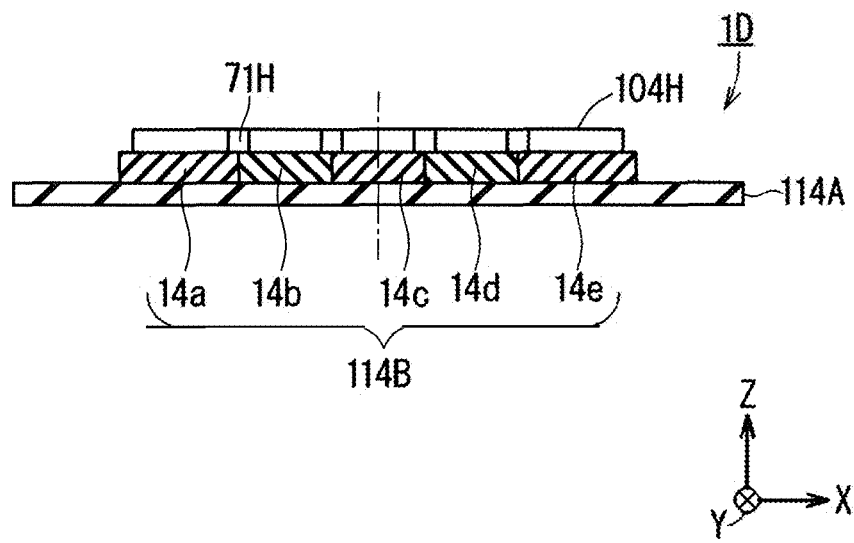

FIGS. 13A and 13B are illustration diagrams showing a structure of a high-voltage side electrode constituent part 1D of an activated gas generation apparatus according to a fourth embodiment of the present invention. FIG. 13A is a top view, and FIG. 13B is a cross-sectional view taken along line F-F of FIG. 13A. In FIGS. 13A and 13B, an XYZ coordinate system is appropriately shown.

The activated gas generation apparatus of the fourth embodiment is different from that of the first embodiment in that a high-voltage side electrode constituent part 1A is replaced by a high-voltage side electrode constituent part 1D, and a ground side electrode constituent part 2A is replaced by a ground side electrode constituent part 2D (not shown).

The activated gas generation apparatus of the fourth embodiment is different from that of the first embodiment in that a high-voltage side electrode constituent part 1A is replaced by a high-voltage side electrode constituent part 1D, and a ground side electrode constituent part 2A is replaced by a ground side electrode constituent part 2D (not shown).

Although not shown, the ground side electrode constituent part 2D includes a dielectric electrode 214 and metal electrodes 204H, 204L formed on the bottom surface of the dielectric electrode 214.

The dielectric electrode 214 has the same structure as that of the dielectric electrode 211 of the first embodiment. The metal electrodes 204H and 204L have the same structure as that of the metal electrodes 201H and 201L, and are provided with the same contents as those of the metal electrodes 201H and 201L on the bottom surface of the dielectric electrode 214. The dielectric electrode 214 may have the same structure as that of the dielectric electrode 212 of the second embodiment.

As shown in FIGS. 13A and 13B, the high-voltage side electrode constituent part 1D includes a dielectric electrode 114 and metal electrodes 104H, 104L formed on the upper surface of the dielectric electrode 114.

As shown in FIG. 13A, the dielectric electrode 114 has a rectangular flat plate structure with an X direction as a longitudinal direction and a Y direction as a short direction as with the dielectric electrode 111.

As shown in FIG. 13B, the dielectric electrode 114 (the one dielectric electrode) includes a partial dielectric electrode 114A which is a first lamination partial dielectric electrode, and a partial dielectric electrode 114B which is a second lamination partial dielectric electrode formed on the partial dielectric electrode 114A. Therefore, the dielectric electrode 114 is configured by the laminated structure of the partial dielectric electrodes 114A and 113B.

As shown in FIG. 13B, both the partial dielectric electrodes 114A and 114B have a uniform film thickness, and the partial dielectric electrode 114B has a dielectric constant changing structure in which five types of partial dielectric regions 14a to 14e having dielectric constants different from each other are provided adjacent to each other along the X direction which is the electrode formation direction.

The partial dielectric regions 14a to 14e are provided in a positional relationship corresponding to spray hole positions P1 to P5 (see FIG. 10C) of a plurality of gas spray holes 55 in the electrode formation direction (X direction).

That is, the partial dielectric region 14e includes the spray hole position P1 in the X direction. The partial dielectric region 14d includes the spray hole position P2 in the X direction. The partial dielectric region 14c includes the spray hole position P3 in the X direction. The partial dielectric region 14b includes the spray hole position P4 in the X direction. The partial dielectric region 14a includes the spray hole position P5 in the X direction.

Specifically, as shown in FIGS. 13A and 13B, the partial dielectric electrode 114B includes the five partial dielectric regions 14a to 14e formed from the left end (the end in the −X direction) to the right end (the end in the +X direction) of the partial dielectric electrode 114B. The partial dielectric regions 14a to 14e are made of constituent materials having dielectric constants different from each other, the partial dielectric electrode 114A is wholly made of the same material.

Here, the partial dielectric regions 14a to 14e are made of constituent materials (dielectric a, dielectric b, dielectric c, dielectric d, and dielectric e) having higher dielectric constants in the order of 14a, 14b, 14c, 14d, and 14e.

Therefore, the dielectric constant of the partial dielectric electrode 114B is stepwisely increased from the left end (dielectric a) to the right (dielectric e) along the X direction. As a result, the combined dielectric capacitance of the entire dielectric electrode 114 is stepwisely increased from the left end to the right end along the X direction.

As described above, in the fourth embodiment, the dielectric electrode 114 having the partial dielectric electrode 114B (the one dielectric electrode) has a dielectric constant changing structure in which the dielectric constant is stepwisely changed along the X direction which is the electrode formation direction.

Metal electrodes 104H, 104L (a pair of first partial metal electrodes; first metal electrode) are formed on the upper surface of the dielectric electrode 114 (partial dielectric electrode 114B), and are disposed so as to face each other with a central region R60 sandwiched therebetween. The central region R60 has a shape equal to that of the central region R50 of the dielectric electrode 214 in plan view. In this case, as with the metal electrodes 204H, 204L, the metal electrodes 104H, 104L have a substantially rectangular shape in plan view, and have the X direction (first direction) as the longitudinal direction (electrode formation direction), and the Y direction (second direction) crossing at a right angle to the X direction as an electrode facing direction. The metal electrodes 104H, 104L face each other along the Y direction.

In the activated gas generation apparatus of the fourth embodiment, in the dielectric space in which the dielectric electrode 114 and the dielectric electrode 214 face each other, a region in which the metal electrodes 104H, 104L and the metal electrodes 204H, 204L overlap with each other in plan view is defined as a discharge space.

In the fourth embodiment, the discharge space is classified into first to fifth partial discharge spaces corresponding to regions overlapping with the partial dielectric regions 14a to 14e in plan view. These first to fifth partial discharge spaces are not divided at all in the discharge space.

As described above, the discharge space can be classified into the first to fifth partial discharge spaces corresponding to the spray hole positions P1 to P5 of the plurality of gas spray holes 55 (five gas spray holes 55(1) to 55(5)) in the electrode formation direction (X direction).

Therefore, the activated gas generation apparatus of the fourth embodiment includes the dielectric electrode 114 (partial dielectric electrode 114B) having the above-described dielectric constant changing structure, whereby the first to fifth partial discharge voltages in the first to fifth partial discharge spaces can be set to values different from each other.

FIG. 14 is an illustration diagram showing, in a table form, a change in a partial discharge voltage due to a laminated structure of partial dielectric electrodes 114A, 114B of the fourth embodiment. FIG. 14 shows contents classified into the partial dielectric regions 14a to 14e.

As shown in FIG. 14, the partial dielectric electrode 114A has a uniform film thickness of 1 mm, and the partial dielectric electrode 114B also has a uniform film thickness of 1 mm without being changed among the partial dielectric regions 14a to 14e. A discharge area is 3,300 mm², and an AC voltage which is the entire applied voltage is 5000 V. The discharge area is an area where the dielectric electrode 114 (partial dielectric electrodes 114A and 114B) and the metal electrodes 104H and 104L overlap with each other in plan view.

Here, the relative dielectric constant of the partial dielectric electrode 114A is "10". On the other hand, the relative dielectric constant of the dielectric a, which is a constituent material of the partial dielectric region 14a, is "10"; the relative dielectric constant of the dielectric b, which is a constituent material of the partial dielectric region 14b, is "20"; the relative dielectric constant of the dielectric c, which is a constituent material of the partial dielectric region 14c is "30"; the relative dielectric constant of the dielectric d, which is a constituent material of the partial dielectric region 14d is "40"; and the relative dielectric constant of the dielectric e, which is a constituent material of the partial dielectric region 14e is "50".

Therefore, the combined dielectric capacitance due to the laminated structure of the partial dielectric electrodes 114A, 114B has values different among the laminated regions in the partial dielectric regions 14a to 14e.

Specifically, the dielectric combined capacitance is $7.34 \cdot 10^{-11}$F in the laminated region in the partial dielectric region 14a, $9.79 \cdot 10^{-11}$ F in the laminated region in the partial dielectric region 14b, $1.10 \cdot 10^{-10}$F in the laminated region in the partial dielectric region 14c, $1.17 \cdot 10^{-10}$ F in the laminated region in the partial dielectric region 14d, and $1.22 \cdot 10^{-10}$ F in the laminated region in the partial dielectric region 14e.

As a result, the partial discharge voltages in the first to fifth partial discharge spaces corresponding to the partial dielectric regions 14a to 14e are changed to 3550 V, 3850 V, 3950 V, 4000 V, and 4050 V.

Therefore, the activated gas generation apparatus of the fourth embodiment can set the activated gas concentration of the partial activated gas proportional to the partial discharge voltage to values different among the plurality of partial activated gases.

As described above, in the first to fifth partial discharge spaces corresponding to the partial dielectric regions 14a to 14e, the partial discharge voltage has a positive correlation with the dielectric constants of the partial dielectric regions 14a to 14e.

On the other hand, the activated gas concentration in the partial activated gas is proportional to the partial discharge voltage, whereby the activated gas concentrations of the partial activated gases generated in the first to fifth partial discharge spaces are lower in the order of the first, second, . . . , fifth partial discharge spaces.

As described above, by applying the dielectric constant changing structure to the dielectric electrode 114 (partial dielectric electrode 114B), a concentration gradient can be provided in the activated gas concentration among the first to fifth partial discharge spaces.

FIG. 15 is a graph showing, in a table form, changes in partial discharge voltages according to specific examples of dielectric types. FIG. 15 shows contents classified into the partial dielectric regions 14a to 14c.

As shown in FIG. 15, the partial dielectric electrode 114A has a uniform film thickness of 1 mm, and the partial dielectric electrode 114B also has a uniform film thickness of 1 mm without being changed among the partial dielectric regions 14a to 14c. A discharge area is 3,300 mm², and an AC voltage which is the entire applied voltage is 5000 V.

Here, the relative dielectric constant of the partial dielectric electrode 114A is "9.9". On the other hand, the relative dielectric constant of quartz which is a constituent material of the partial dielectric region 14a is "3.8"; the relative dielectric constant of alumina which is a constituent material of the partial dielectric region 14b is "9.9"; and the relative dielectric constant of HfO₂ (hafnium oxide) which is a constituent material of the partial dielectric region 14c is "15".

Therefore, the combined dielectric capacitance due to the laminated structure of the partial dielectric electrodes 114A, 114B has values different among the partial dielectric regions 14a to 14c.

That is, the laminated region in the partial dielectric region 14a has a combined dielectric capacitance of $4.0 \cdot 10^{-11F}$; the laminated region in the partial dielectric region 14b has a combined dielectric capacitance of $7.0 \times 10^{-11F}$; and the laminated region in the partial dielectric region 14c has a combined dielectric capacitance of $9.0 \cdot 10^{-11F}$.

As a result, the partial discharge voltages in the first to third partial discharge spaces corresponding to the partial dielectric regions 14a to 14c are changed to 2900 V, 3550 V, and 3750 V.

Therefore, the activated gas concentration of the partial activated gas proportional to the partial discharge voltage among the partial dielectric regions 14a to 14c can be set to values different among the plurality of partial activated gases.

Thus, from FIG. 15, a significant difference can be provided in the dielectric constant among the partial dielectric regions 14a to 14c by using different constituent materials among the partial dielectric regions 14a to 14c.

As described above, the dielectric constant changing structure of the dielectric electrode 114 causes the dielectric constant to be changed along the electrode formation direction (X direction) so that the plurality of partial discharge voltages generated in the plurality of partial discharge spaces when the AC voltage is applied have values different from each other.

That is, the dielectric constant of the partial dielectric electrode 114B in the dielectric electrode 114 (the one dielectric electrode) becomes a discharge voltage contribution parameter, and the dielectric constant changing structure of the dielectric electrode 114 functions as a parameter changing structure in which the discharge voltage contribution parameter is changed.

The activated gas generation apparatus of the fourth embodiment having such a structure sprays the activated gas containing a plurality of partial activated gases sprayed from the plurality of gas spray holes 55 provided in the dielectric electrode 214 to the outside.

Therefore, in the activated gas generation apparatus of the fourth embodiment, by appropriately setting the dielectric constant of the partial dielectric electrode 114A, the dielectric constant of each of the partial dielectric regions 14a to 14e of the partial dielectric electrode 114B, and the arrangement of the plurality of gas spray holes 55, the concentration of the activated gas can be changed among the plurality of partial activated gases in the activated gas to be sprayed.

As described above, the activated gas generation apparatus of the fourth embodiment has the dielectric constant changing structure (parameter changing structure) in which the dielectric constant (discharge voltage contribution parameter) is changed along the electrode formation direction so that the first to fifth partial discharge voltages generated in the first to fifth partial discharge spaces when the AC voltage is applied have values different from each other.

The activated gas generation apparatus of the fourth embodiment has the characteristics, and thus can exhibit an effect of spraying the activated gas containing a plurality of types of partial activated gases having activated gas concentrations different from each other to the outside by applying one AC voltage from the high-frequency power supply 5 without dividing the discharge space into a plurality of parts.

Furthermore, in the fourth embodiment, the film thickness of the dielectric electrode 114, which is the one dielectric electrode, can be made uniform, whereby both the dielectric electrode 114 and the dielectric electrode 214 can have a uniform film thickness as with the conventional structure.

As a result, the activated gas generation apparatus of the fourth embodiment can form the metal electrodes 104H, 104L with high precision on the upper surface of the dielectric electrode 114, and form the metal electrodes 204H, 204L with high accuracy on the bottom surface of the dielectric electrode 214. In addition, even under conditions where it is difficult to make the dielectric electrode thicker in terms of space, the activated gas generation apparatus of the fourth embodiment can cope with no problem.

In the fourth embodiment, the existing partial dielectric electrode 114A having a uniform dielectric constant and a uniform film thickness can be used as the first lamination partial dielectric electrode, whereby the dielectric constant changing structure can be achieved only by newly adding the partial dielectric electrode 114B serving as the second lamination partial dielectric electrode while using the existing dielectric electrode.

The partial dielectric regions 14a to 14e containing dielectrics a to e having a high dielectric constant as constituent materials may be formed in a plate shape, and placed on the upper surface of the partial dielectric electrode 114A. When the dielectric constant is sufficiently high, the partial dielectric regions 14a to 14e may be directly formed on the upper surface of the partial dielectric electrode 114A by sputtering or the like.

The material of the partial dielectric electrode 114A serving as a discharge surface is fixed to high-purity alumina or sapphire from the viewpoint of not generating impurities such as particles.

On the other hand, the partial dielectric electrode 114B serving as a metal electrode formation surface is not exposed to discharge, so that it is not necessary to consider restrictions in terms of substrate contamination. Therefore, as the constituent material of the partial dielectric regions 14a to 14e of the partial dielectric electrode 114B, the dielectric constant can be selected with the highest priority.

<Other>

In the first to fourth embodiments, if the AC voltage applied from the high-frequency power supply 5 is not increased when the film thicknesses of the dielectric electrodes 111 to 114 and the dielectric electrodes 211 to 214 are too large, sufficient discharge power cannot be generally obtained in the discharge space. On the other hand, if the AC voltage is increased, many insulation measures are required. Therefore, it is desirable that the AC voltage, which is the applied voltage, is as low as possible. For this reason, there is a concern that the AC voltage cannot be increased without limitation.

The activated gas generation apparatuses of the first to third embodiments adopting the film thickness changing structure have the above-mentioned concern.

On the other hand, in the activated gas generation apparatus of the fourth embodiment, the film thicknesses of both the dielectric electrodes 114 and 214 can be made uniform. Therefore, when the voltage level of the AC voltage is desired to be suppressed, all the dielectrics a to e used as the constituent materials of the partial dielectric regions 14a to 14e are formed of a high dielectric constant material having a dielectric constant higher than a predetermined dielectric constant. This can provide a suppressed voltage level. The relative dielectric constant=10 is considered as the predetermined dielectric constant.

In the above-described first to fourth embodiments, the parameter changing structure (film thickness changing structure or dielectric constant changing structure) is provided on the dielectric electrodes 111 to 114 (first dielectric electrodes) without being limited thereto.

That is, the parameter changing structure may be provided in the dielectric electrodes 211 to 214 (second dielectric electrode) instead of the dielectric electrodes 111 to 114, or the parameter changing structure may be provided in both the dielectric electrodes 111 to 114 and the dielectric electrodes 211 to 214.

The dielectric electrodes 111 to 114 have a bottom surface having nothing, which exhibit an advantage that the parameter changing structure can be easily provided as compared with the dielectric electrodes 211 to 214. The parameter changing structure is provided in both the dielectric electrodes 111 to 114 and the dielectric electrodes 211 to 214, which exhibits an advantage that a change in the discharge voltage contribution parameter (film thickness, dielectric constant) can be increased as compared with the case where the parameter changing structure is provided on one side.

While the present invention has been described in detail, the foregoing description is in all aspects illustrative, and the present invention is not limited thereto. It is understood that numerous modifications not illustrated can be devised without departing from the scope of the present invention.

That is, in the present invention, respective embodiments can be freely combined, and each of the embodiments can be appropriately altered or omitted within the scope of the invention.

For example, in the activated gas generation apparatus of the fourth embodiment, a combined structure of the dielectric constant changing structure and the film thickness changing structure may be achieved by increasing the film thicknesses of the partial dielectric regions 14a to 14e in the order of the partial dielectric regions 14e to 14a.

In the dielectric electrode 113 of the third embodiment, the structure of the partial dielectric electrode 113B may be changed to a structure in which the film thickness is stepwisely changed as in the dielectric electrode 112 of the second embodiment.

The invention claimed is:

1. An activated gas generation apparatus comprising:
a first electrode constituent part;
a second electrode constituent part provided below said first electrode constituent part; and
an alternating current (AC) power supply part applying an AC voltage to said first and second electrode constituent parts,
said AC power supply part applying said AC voltage to form a discharge space between said first and second electrode constituent parts, and to generate an activated gas obtained by activating a source gas supplied to said discharge space, wherein:
said first electrode constituent part includes a first dielectric electrode and a first metal electrode selectively formed on an upper surface of said first dielectric electrode;
said second electrode constituent part includes a second dielectric electrode and a second metal electrode selectively formed on a bottom surface of said second dielectric electrode;
where said first and second dielectric electrodes face each other in a dielectric space, and where said first and second metal electrodes overlap each other in plan view is defined as said discharge space in a region;
said first and second metal electrodes are formed so as to extend in an electrode formation direction, a gas supply direction of said source gas crosses to said electrode formation direction:
said second dielectric electrode includes a plurality of gas spray holes for spraying said activated gas to an outside;
said activated gas contains a plurality of partial activated gases sprayed from said plurality of gas spray holes;
said plurality of gas spray holes are formed along said electrode formation direction;
said discharge space is classified into a plurality of partial discharge spaces corresponding to positions of said plurality of gas spray holes in said electrode formation direction; and
one dielectric electrode being one of said first and second dielectric electrodes has a parameter changing structure in which a discharge voltage contribution parameter is changed along said electrode formation direction so that a plurality of partial discharge voltages generated in said plurality of partial discharge spaces have values different from each other when said AC voltage is applied.

2. The activated gas generation apparatus according to claim 1, wherein:
said discharge voltage contribution parameter includes a film thickness of said one dielectric electrode; and
said parameter changing structure includes a film thickness changing structure in which the film thickness of said one dielectric electrode is changed along said electrode formation direction.

3. The activated gas generation apparatus according to claim 2,
wherein said film thickness changing structure is a structure in which the film thickness of said one dielectric electrode is continuously changed along said electrode formation direction.

4. The activated gas generation apparatus according to claim 2, wherein:
said one dielectric electrode is classified into a plurality of dielectric partial regions based on positions where said plurality of gas spray holes are provided in said electrode formation direction; and
said film thickness changing structure is a structure in which the film thickness is changed between said plurality of dielectric partial regions.

5. The activated gas generation apparatus according to claim 2,
wherein:
said one dielectric electrode includes a first lamination partial dielectric electrode and a second lamination partial dielectric electrode;
said first and second lamination partial dielectric electrodes are laminated;
said first lamination partial dielectric electrode has a uniform film thickness; and
said second lamination partial dielectric electrode has said film thickness changing structure.

6. The activated gas generation apparatus according to claim 1,
wherein:
said discharge voltage contribution parameter includes a dielectric constant of said one dielectric electrode; and
said parameter changing structure includes a dielectric constant changing structure in which the dielectric constant of said one dielectric electrode is changed along said electrode formation direction.

7. The activated gas generation apparatus according to claim 6,
wherein:
said one dielectric electrode includes a first lamination partial dielectric electrode and a second lamination partial dielectric electrode;
said first and second lamination partial dielectric electrodes are laminated;
said first lamination partial dielectric electrode has a uniform dielectric constant; and
said second lamination partial dielectric electrode has said dielectric constant changing structure.

8. The activated gas generation apparatus according to claim 1,
wherein:
said second metal electrode includes a pair of second partial metal electrodes formed so as to face each other with a central region of said second dielectric electrode interposed therebetween in plan view;
said pair of second partial metal electrodes are formed along said electrode formation direction, and have a direction intersecting with said electrode formation direction as an electrode facing direction in which said pair of second partial metal electrodes face each other:
said first metal electrode includes a pair of first partial metal electrodes including a region overlapping with said pair of second partial metal electrodes in plan view; and
said plurality of gas spray holes are formed in said central region.

9. The activated gas generation apparatus according to claim 1,
wherein:
said one dielectric electrode includes a first lamination partial dielectric electrode and a second lamination partial dielectric electrode;
said first and second lamination partial dielectric electrodes are laminated;
said first lamination partial dielectric electrode has a uniform dielectric constant; and
said second lamination partial dielectric electrode has parameter changing structure in which a dielectric constant of said second lamination partial dielectric electrode is changed along said electrode formation direction, as said parameter changing structure.

10. The activated gas generation apparatus according to claim 9,
wherein said second lamination partial dielectric electrode includes plurality of partial dielectric regions being composed of constituent materials having different dielectric constants from each other, and said plurality of partial dielectric regions being placed in line along said electrode formation direction, in which said dielectric constants of said plurality of partial dielectric regions increasing in said electrode formation direction.

11. The activated gas generation apparatus according to claim 10,
wherein said first lamination partial dielectric electrode and said second lamination partial dielectric electrode has a uniform film thickness.

* * * * *